(12) United States Patent
Lottes et al.

(10) Patent No.: US 11,798,835 B2
(45) Date of Patent: Oct. 24, 2023

(54) METHODS FOR PREPARING A SOI STRUCTURE

(71) Applicant: GlobalWafers Co., Ltd., Hsinchu (TW)

(72) Inventors: Charles R. Lottes, Ballwin, MO (US); Shawn George Thomas, Chesterfield, MO (US); Henry Frank Erk, St. Louis, MO (US)

(73) Assignee: GlobalWafers Co., Ltd., Hsinchu (TW)

(*) Notice: Subject to any disclaimer, the term of this patent is extended or adjusted under 35 U.S.C. 154(b) by 87 days.

(21) Appl. No.: 17/667,256

(22) Filed: Feb. 8, 2022

(65) Prior Publication Data

US 2022/0165609 A1 May 26, 2022

Related U.S. Application Data

(62) Division of application No. 17/085,422, filed on Oct. 30, 2020, now Pat. No. 11,282,739.

(60) Provisional application No. 62/947,981, filed on Dec. 13, 2019.

(51) Int. Cl.
*H01L 21/762* (2006.01)
*H01L 21/306* (2006.01)
*H01L 21/84* (2006.01)
*H01L 21/02* (2006.01)

(52) U.S. Cl.
CPC .. *H01L 21/76254* (2013.01); *H01L 21/30604* (2013.01); *H01L 21/84* (2013.01); *H01L 21/02052* (2013.01)

(58) Field of Classification Search
CPC ......... H01L 21/76254; H01L 21/30604; H01L 21/84; H01L 21/02002; H01L 21/76251

USPC .................. 438/458, 149, 479, 517; 257/347
See application file for complete search history.

(56) References Cited

U.S. PATENT DOCUMENTS

| | | | |
|---|---|---|---|
| 6,123,865 A | 9/2000 | Lin et al. | |
| 6,265,328 B1 | 7/2001 | Henley et al. | |
| 7,306,002 B2 | 12/2007 | Kim et al. | |
| 8,486,201 B2 | 7/2013 | Plihon | |
| 10,155,252 B2 | 12/2018 | Lee et al. | |
| 2008/0315349 A1 | 12/2008 | Takei et al. | |
| 2011/0180113 A1* | 7/2011 | Chien et al. | H01L 21/67051 134/32 |

(Continued)

FOREIGN PATENT DOCUMENTS

| | | |
|---|---|---|
| EP | 1480265 A2 | 11/2004 |
| EP | 1855309 A1 | 11/2007 |
| WO | 2010062852 A1 | 6/2010 |

OTHER PUBLICATIONS

Thom A. Coney and William J. Masica, "Effect of Flow Rate on the Dynamic Contact Angle For Wetting Liquids", NASA Technical Note, NASA TN D-5115, National Aeronautics and Space Administration, Washington D.C., Mar. 1969.

(Continued)

*Primary Examiner* — Thinh T Nguyen
(74) *Attorney, Agent, or Firm* — Armstrong Teasdale LLP

(57) ABSTRACT

Methods for removing an oxide film from a silicon-on-insulator structure are disclosed. The oxide may be stripped from a SOI structure before deposition of an epitaxial silicon thickening layer. The oxide film may be removed by dispensing an etching solution toward a center region of the SOI structure and dispensing an etching solution to an edge region of the structure.

17 Claims, 22 Drawing Sheets

(56) References Cited

U.S. PATENT DOCUMENTS

2015/0206790 A1  7/2015  Aga et al.

OTHER PUBLICATIONS

Hao Wang and Lei Chen, "A General Model for Dynamic Contact Angle Over Full Speed Regime", The Laboratory of Heat and Mass Transport at Micro-Nano Scale, College of Engineering, Peking University, Beijing 100871, China, : arXiv:1902.01204 (2019).
http://www.acmrcsh.com/wlp-products/wet-stripping-systems/, available before Dec. 13, 2019.
https://www.ap-s.de/products/single-wafer-processing/, available before Dec. 13, 2019.
https://www.mdc-europe.com/mdc-equipments/spinetcher-spe-200/#more-603, available before Dec. 13, 2019.
http://www.decker-anlagenbau.de/en/silicon-cleaning/special-systems/spin-etcher.html, available before Dec. 13, 2019.
https://www.kedsemi.com/en/product-595056/Single-Wafer-Etcher-AST-E300.html, available before Dec. 13, 2019.
https://www.lamresearch.com/product/eos/, available before Dec. 13, 2019.
https://www.lamresearch.com/product/dv-prime-da-vinci/, available before Dec. 13, 2019.
http://www.nexgenws.com/products/, available before Dec. 13, 2019.
http://www.textechmarketing.com/textech_008.htm, available before Dec. 13, 2019.
https://screen-spe.com/home/products-technology/products/spin-processor/single-wafer-cleaner-su-3100, available before Dec. 13, 2019.
http://www.tazmoinc.com/files/product_ssp.html, available before Dec. 13, 2019.
https://www.veeco.com/products/metalubmrdl-etch-waferetch-platform, available before Dec. 13, 2019.
International Search Report and Written Opinion for PCT/US2020/062578, dated Mar. 23, 2021, 14 pages.

* cited by examiner

SOI Bond Pair Before Cleaving

SOI Bond Pair After Cleaving

SOI Wafer With Void After Annealing

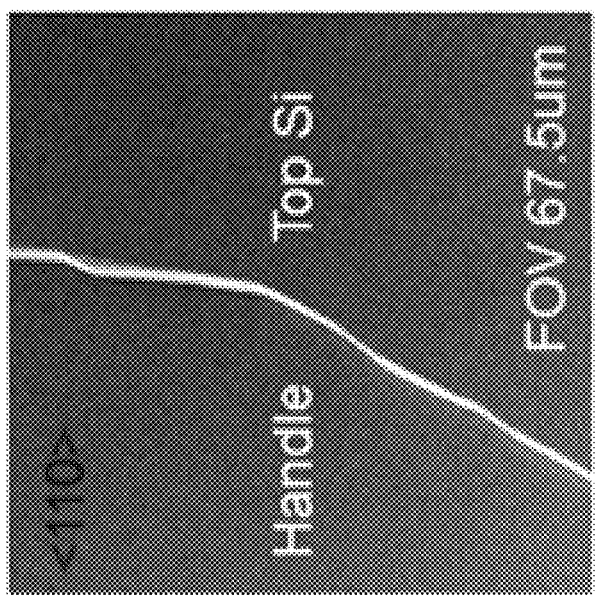
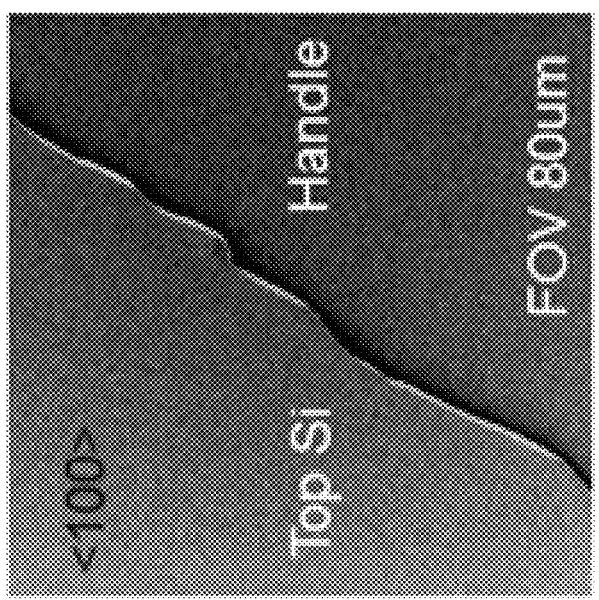
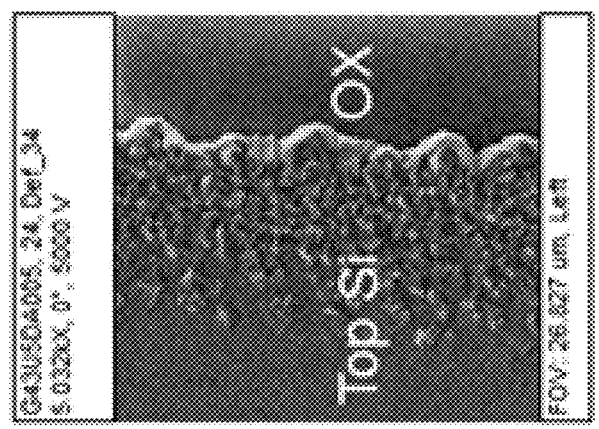
FIG. 9

CE Process (Center Edge)

| Microscope Position | Undercut Area, $\mu m^2$ | Pull-out Edge Length, $\mu m$ | Undercut Edge Length, $\mu m$ | Undercut by Pull-out dimension, $\mu m$ | Undercut by Undercut Edge Length, $\mu m$ | Average Undercut $\mu m$ |
|---|---|---|---|---|---|---|
| Bottom | 343.331 | 141.028 | 127.037 | 2.40 | 2.70 | 2.55 |

METHODS FOR PREPARING A SOI STRUCTURE

CROSS-REFERENCE TO RELATED APPLICATION

This application is a Divisional of U.S. Non-provisional patent application Ser. No. 17/085,422, filed Oct. 30, 2020, which claims the benefit of U.S. Provisional Patent Application No. 62/947,981, filed Dec. 13, 2019. Both of these applications are incorporated herein by reference in their entirety.

FIELD OF THE DISCLOSURE

The field of the disclosure relates to methods for removing an oxide film from a silicon-on-insulator (SOI) structure and, in particular, methods for stripping an oxide from a SOI structure before deposition of an epitaxial silicon thickening layer.

BACKGROUND

Silicon-on-insulator structures may be subjected to epitaxial processes in which silicon is deposited on the silicon top layer to increase the thickness of the top layer. The quality of the silicon epitaxial layer depends on the quality of the surface on which the epitaxial layer is deposited. The SOI structure may be subjected to an anneal before deposition of the epitaxial silicon layer. This anneal may cause an oxide ($SiO_2$) to form on the surfaces of the SOI structure. This oxide is typically removed from the top surface of the structure before the epitaxial deposition. In some instances, a terrace oxide (i.e., thicker oxide) forms near the edge of the SOI structure top surface during the anneal. The terrace oxide may be at the edge portion of the SOI structure where the entire donor was removed (i.e., the donor below the cleave plane) due to lack of bonding near the rounded edge of the donor. The terrace oxide may be an oxide that was grown on the handle wafer that remains after the donor is removed. This terrace oxide complicates oxide removal as the oxide is non-uniform across the wafer surface.

Conventional methods for removing the oxide may involve immersion stripping in which the wafer is immersed in a wet cleaner/etcher. This removes the oxide from all surfaces of the SOI structure including the backside. The backside oxide may protect the bottom surface of the SOI structure against scratching and damage when the SOI structures is handled and may act as a backside seal to prevent contamination or autodoping of the SOI structure during epitaxy. Masking may be used to protect the backside oxide. However masking may cause damage to the top silicon layer (e.g., during wafer tape adhesion and removal wherein force is applied to the top surface to set the adhesive on the tape or to remove the adhered tape from the backside). Masking may also suffer from etch leak at the edges of the tape causing degraded oxide removal wrap-around or extension.

Additional oxide stripping methods may involve wafer spinning in which the etching solution is distributed at the wafer center with the etching solution "fanning out" over the wafer to remove the oxide. Both immersion and wafer spin techniques causes hydrogen fluoride (HF) undercuts to form on the silicon top layer surface. As shown in FIG. 1, cleaving of the bonded wafer structure during preparation of the SOI structure may cause a void to form in the silicon layer. Voids occur when a portion of the top layer and dielectric layer are pulled up with the spent donor structure. As shown in FIG. 2, when the voids are exposed to HF etching solution, the HF degrades the dielectric layer below the silicon top layer because HF etches the dielectric material (e.g., silica) more readily than silicon.

A need exists for methods for removing the oxide on the top surface of the SOI structure that are able to remove the terrace oxide while reducing HF undercuts and that are able to preserve the backside oxide. A need exists for methods for preparing SOI structures that use such oxide stripping methods.

This section is intended to introduce the reader to various aspects of art that may be related to various aspects of the disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

SUMMARY

One aspect of the present disclosure is directed to a method for removing an oxide film from a silicon-on-insulator structure. A silicon-on-insulator structure is provided. The silicon-on-insulator structure has a handle structure, a silicon top layer and a dielectric layer disposed between the handle structure and the silicon layer. The silicon-on-insulator structure has an oxide film on a top surface of the silicon-on-insulator structure. The silicon-on-insulator structure has a radius R that extends from a center to a circumferential edge of the silicon-on-insulator structure. An etching solution is directed to a center region of the top surface of the silicon-on-insulator structure while spinning the silicon-on-insulator structure. An etching solution is directed to an edge region of the top surface of the silicon-on-insulator structure while spinning the silicon-on-insulator structure. The edge region is disposed radially outward from the center region.

Yet another aspect of the present disclosure is directed to a method for preparing a silicon-on-insulator structure comprising a silicon top layer, a handle structure and dielectric layer disposed between the silicon top layer and handle structure. Ions are implanted into a donor structure to form a cleave plane in the donor structure. A handle structure is provided. A dielectric layer is formed on at least one of the donor structure and handle structure prior to bonding. The donor structure is bonded to the handle structure to form a bonded wafer structure comprising the donor structure, handle structure and a dielectric layer disposed between the handle structure and the donor structure. The bonded wafer structure is cleaved at the cleave plane such that a portion of the donor structure remains bonded to the handle structure as a silicon top layer, the cleave forming a silicon-on-insulator structure comprising the handle structure, silicon top layer and dielectric layer disposed between the handle layer and silicon top layer. The silicon-on-insulator structure is annealed with an oxide forming on at least a top surface of the silicon-on-insulator structure during the anneal. A center region of the top surface of the silicon-on-insulator structure is contacted with an etching solution while spinning the silicon-on-insulator structure. An edge region of the top surface of the silicon-on-insulator structure is contacted with the etching solution while spinning the silicon-on-insulator structure. An epitaxial silicon layer is deposited on the silicon top layer after contacting the center region and the edge region of the top surface of the silicon-on-insulator structure.

Various refinements exist of the features noted in relation to the above-mentioned aspects of the present disclosure. Further features may also be incorporated in the above-mentioned aspects of the present disclosure as well. These refinements and additional features may exist individually or in any combination. For instance, various features discussed below in relation to any of the illustrated embodiments of the present disclosure may be incorporated into any of the above-described aspects of the present disclosure, alone or in any combination.

BRIEF DESCRIPTION OF THE DRAWINGS

FIG. 9 are photos of the top silicon edge for low temperature epitaxial deposition and terrace oxide (left panel) and high temperature epitaxial deposition without oxide (center and right panels);

Corresponding reference characters indicate corresponding parts throughout the drawings.

DETAILED DESCRIPTION

Provisions of the present disclosure relate to methods for stripping an oxide film from a silicon-on-insulator structure (which may be referred to herein as "SOI structure" or even more simply "wafer"). Embodiments of the oxide stripping method may involve a center-to-edge (CE) spin etch in which etchant solution is dispersed near the center of the structure while spinning the structure in a first phase and etchant is then dispensed toward the structure edge while spinning the structure in a second phase.

Methods for Forming Silicon-on-Insulator Structures

The methods of the present disclosure for removing an oxide may generally be used with any bonded wafer structure in which it is desirable to remove an oxide film. In some embodiments, the structure that is processed may be a silicon-on-insulator structure. Such structures may include a handle wafer, a silicon layer (sometimes referred to as a "silicon device layer" or "silicon top layer") and a dielectric layer disposed between the handle wafer and silicon layer. The following is merely one example of methods and systems for preparing a silicon-on-insulator structure and other methods may be used unless stated otherwise.

Figure 1A:
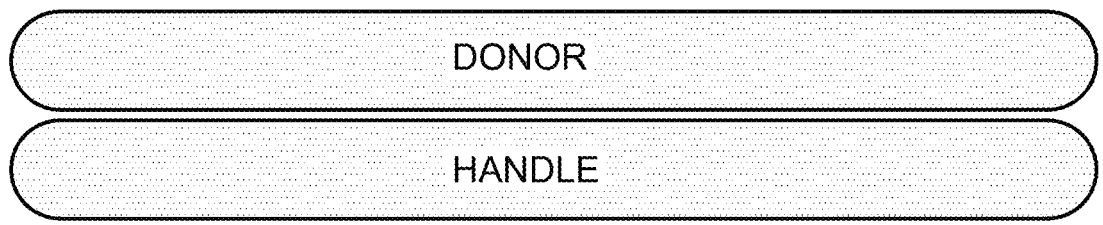
FIGS. 1-2 are schematics that show formation of HF undercuts on a SOI structure.
Figure 1B:
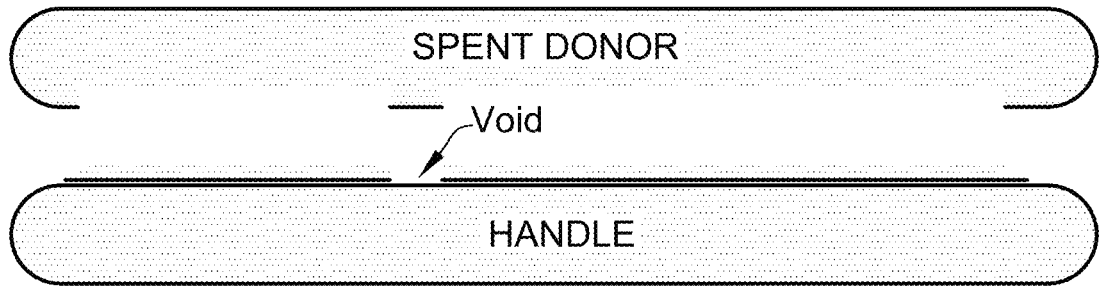
Figure 1C:
Figure 2:
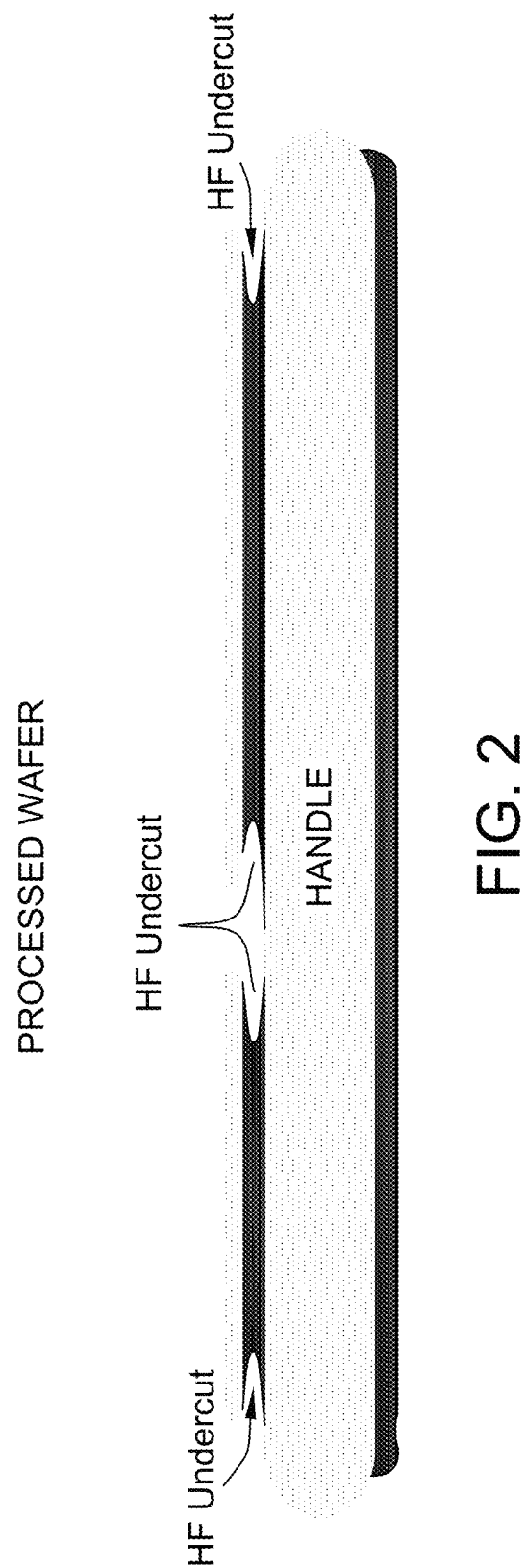
Figure 3:
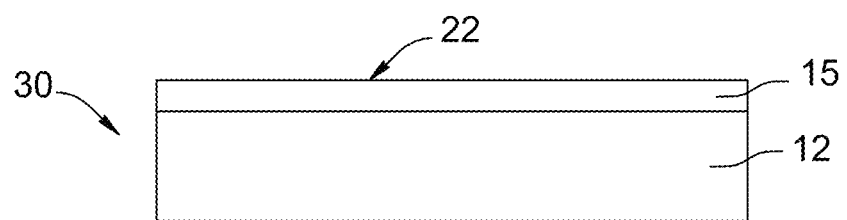
FIG. 3 is a cross-section view of a donor structure having a donor wafer with a dielectric layer thereon.

An example of a donor structure 30 that may be bonded to a handle structure to form a bonded wafer structure is shown in FIG. 3. The donor structure 30 may be formed with a dielectric layer 15 deposited on the front surface of a donor wafer 12. It should be understood that, alternatively, the dielectric layer 15 may be grown or deposited on the handle wafer or a dielectric layer may be grown on both the donor wafer and handle wafer and that these structures may be bonded in any of the various arrangements without limitation. Suitable donor wafers 12 may be composed of silicon, germanium, silicon germanium, gallium nitride, aluminum nitride, gallium arsenide, indium gallium arsenide and any combination thereof. In some embodiments, the donor wafer is composed of single crystal silicon.

The dielectric layer 15 may be any electrically insulating material suitable for use in a SOI structure, such as a material comprising $SiO_2$, $Si_3N_4$, aluminum oxide, or magnesium oxide. In some embodiments, the dielectric layer 15 is $SiO_2$ (i.e., the dielectric layer consists essentially of $SiO_2$). In embodiments in which the dielectric layer is silica ($SiO_2$), the dielectric layer is sometimes referred to as a "buried oxide" or "BOX" layer 15. The dielectric layer 15 may be applied according to any known technique in the art, such as thermal oxidation, wet oxidation, thermal nitridation or a combination of these techniques.

Figure 4:
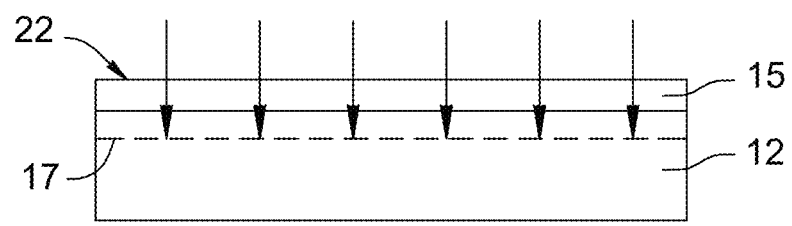
FIG. 4 is cross-section view of the donor structure during ion implantation thereon.

As shown for example in FIG. 4, ions (e.g., hydrogen atoms, helium atoms or a combination of hydrogen and helium atoms) may be implanted at a substantially uniform specified depth beneath the front surface 22 of the donor structure to define a cleave plane 17. It should be noted, that when helium and hydrogen ions are co-implanted into the structure to form the cleave plane 17, they may be implanted concurrently or sequentially. In some embodiments, ions are implanted prior to deposition of the dielectric layer 15. When implantation is performed prior to deposition of the dielectric layer 15, the subsequent growth or deposition of the dielectric layer on the donor wafer 12 is suitably performed at a temperature low enough to prevent premature separation or cleaving along plane 17 in the donor layer (i.e., prior to the wafer bonding process step).

The handle structure 10 (FIG. 5) may include a handle wafer obtained from any suitable material for preparing multi-layered structures, such as silicon, silicon carbide, sapphire, germanium, silicon germanium, gallium nitride, aluminum nitride, gallium arsenide, indium gallium arsenide, quartz and combinations thereof. The handle structure 10 may include a dielectric layer deposited on a handle wafer or, as in other embodiments, consists only of a handle wafer (i.e., does not include a dielectric layer). The handle wafer and donor wafer may be single crystal silicon wafers and may be single crystal silicon wafers which have been sliced from a single crystal ingot grown in accordance with conventional Czochralski crystal growing methods.

Figure 5:
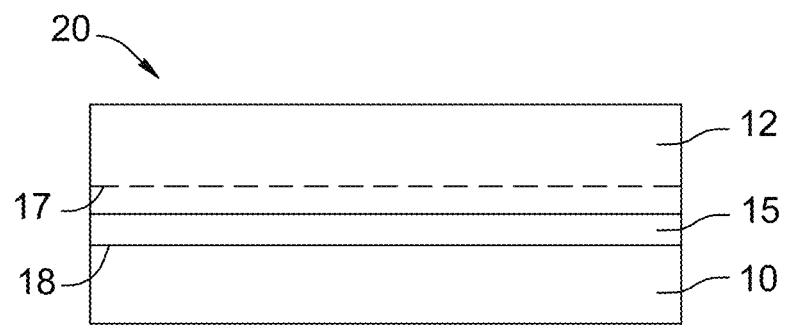
FIG. 5 is a cross-section view of the donor structure bonded to a handle structure.

As shown in FIG. 5, the front surface of the dielectric layer 15 of the donor structure is suitably bonded to the front surface of the handle structure 10 to form a bonded wafer structure 20 through a bonding process. The dielectric layer 15 and handle structure 10 may be bonded together while performing a surface activation by exposing the surfaces of the structures to a plasma containing, for example, oxygen or nitrogen. The wafers are then pressed together and a bond at the bond interface 18 is formed there between. Generally speaking, wafer bonding may be achieved using essentially any technique known in the art, provided the energy employed to achieve formation of the bond interface is sufficient to ensure that the integrity of the bond interface is sustained during subsequent processing (i.e., layer transfer by separation along the cleave or separation plane 17 in the donor wafer).

Once prepared, the bonded wafer structure 20 is placed in the cleaving device to separate (i.e., cleave) a portion of the donor wafer along the cleave plane from the bonded structure to form the layered semiconductor structure (e.g., SOI structure). Generally speaking, the cleaving device may induce this fracture using techniques known in the art, such as thermally and/or mechanically induced cleaving techniques.

Figure 6:
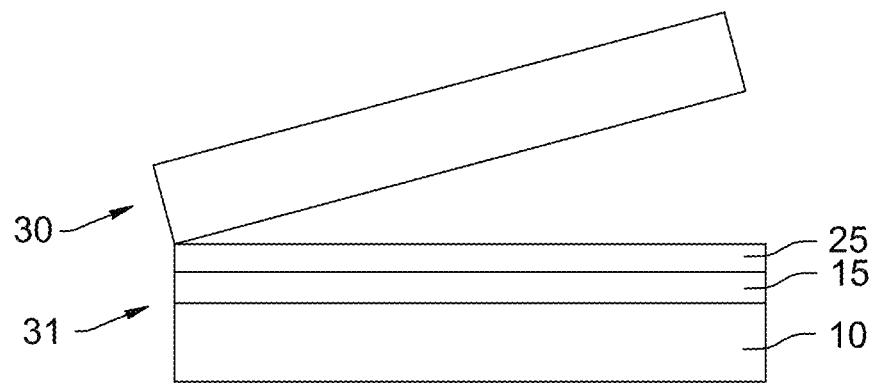
FIG. 6 is a cross-section view of a bonded wafer structure upon cleaving the donor structure at the cleave plane.

Referring to FIG. 6, upon separation, two structures 30, 31 are formed. Because the separation of the bonded wafer structure 20 occurs along the cleave plane 17 in the donor structure 12 (FIG. 5), a portion of the donor structure remains part of both structures (i.e., a portion of the donor wafer is transferred along with the dielectric layer 15). Structure 30 comprises a portion of the donor wafer. Structure 31 is the SOI structure and includes a handle structure 10, dielectric layer 15 and silicon top layer 25 (the portion of the donor wafer remaining after cleaving) disposed atop the dielectric layer 15. In embodiments in which the donor structure and handle structure both include a dielectric layer, the dielectric layers combine to form the dielectric layer 15 of the SOI structure.

The cleaving device used to separate the bonded wafer structure along the cleave plane may be a mechanical cleaving device in which separation is induced or achieved by means of mechanical force, either alone or in addition to annealing. For instance, the bonded structure may be placed in a fixture in which mechanical force is applied perpendicular to the opposing sides of the bonded structure in order to pull a portion of the donor structure apart from the bonded structure.

An example cleaving device includes suction cups that apply mechanical force near a leading cleave edge of the bonded wafer structure 20. The separation of the portion of the donor wafer may be initiated by applying a mechanical wedge or blade at the edge of the bonded wafer at the cleave plane 17 in order to initiate propagation of a crack along the cleave plane 17. The mechanical force applied by the suction cups then pulls the portion of the donor structure from the bonded structure, thus forming the SOI structure. Mechanical cleaving devices are commercially available such as the Debond & Cleave Tools from Silicon Genesis Corporation (San Jose, Calif.).

In alternative embodiments, the cleaving device is a thermal cleaving device in which fracturing is achieved by annealing the bonded structure. For example, a thermal cleave may performed at a temperature about 200° C. to about 800° C., or from about 250° C. to about 650° C. for a period of at least about 10 seconds, at least about 1 minute, at least about 15 minutes, at least about 1 hour or even at least about 3 hours (with higher temperatures requiring shorter anneal times, and vice versa), under an inert (e.g., argon or nitrogen) atmosphere or ambient conditions. The thermal cleaving device may be a belt furnace in which propagation of the cleave is achieved at the leading edge of the bonded structure (i.e., the leading edge in the direction of travel of the structure through the furnace) and proceeds toward the trailing edge of the bonded wafer structure. Other types of cleaving devices may also be used.

Figure 7:
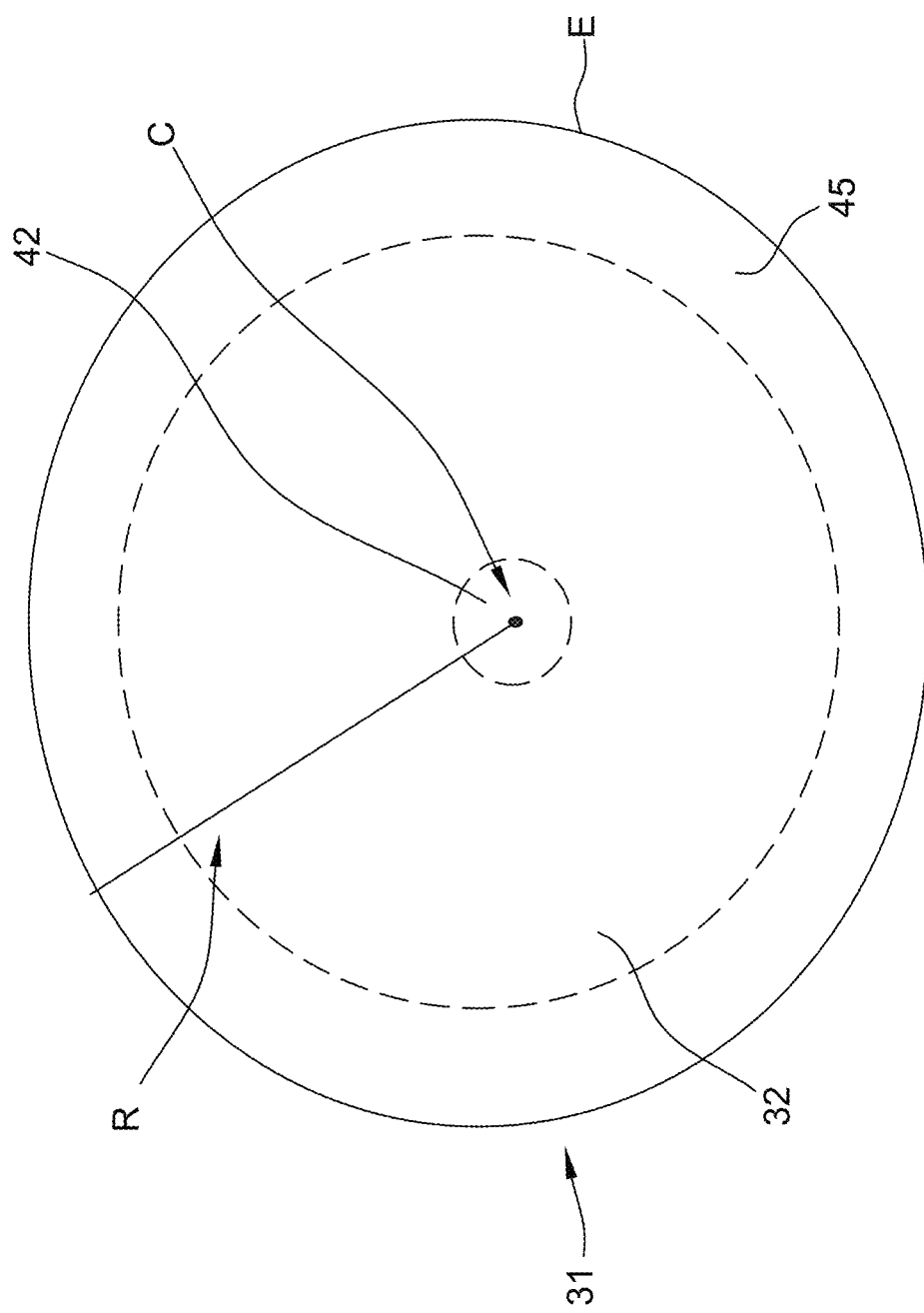
FIG. 7 is a top view of a SOI structure.

The layers (handle structure 10, dielectric layer 15 and silicon top layer 25) of the SOI structure 31 may generally have any thickness that allows the layers to function as described herein. In some embodiments, the silicon top layer 25 is relatively thin (e.g., thickness of about 0.1 µm to about 0.3 µm) and the dielectric layer 15 is relatively thick (about 1.0 µm or more). The SOI structure 31 has a radius R (FIG. 7) that extends from the center C of the structure 31 to the circumferential edge E. The SOI structure 31 may have any radius (e.g., about 100 mm, about 150 mm or more) unless stated otherwise.

Anneal

The cleave surface of the SOI structure 31 (i.e., the thin device layer 25 of the donor wafer) has a rough surface that may be smoothed by additional processing. The structure 31 may be subjected to additional processing to produce a layer surface having desirable features for device fabrication thereon and/or for deposition of a thickening epitaxial layer.

In accordance with some embodiments of the present disclosure, the silicon-on-insulator structure 31 is subjected to a pre-epitaxy smoothing anneal (PESA). The smoothing anneal reorders the silicon on the top surface 32 (FIG. 7) of the structure 31. Without being bound to any particular theory, the smoothing anneal also strengthens the oxide to oxide bond between the handle structure 10 and the silicon device layer 25 (i.e., in embodiments in which the handle and donor wafers include an oxide on their bonding surfaces). Prior to the anneal, the surface 32 of the structure 31 may optionally undergo cleaning and/or a brief etching or planarization.

In some embodiments, the anneal of the silicon-on-insulator structure 31 is performed at a temperature of at least about 900° C., at least about 1000° C. or at least about 1050° C. (e.g., about 1050° C. to about 1150° C.). The length of the anneal may vary (e.g., 0.5 hours to 16 hours) and with higher anneal temperatures corresponding to lower anneal periods and vice versa. Example ambients include $O_2$, $N_2$, $H_2$, argon and combinations thereof. The anneal causes an oxide to form on the surfaces (i.e., all exposed surfaces during the anneal) of the SOI structure 31. The thickness of the oxide may vary and in some embodiments is from about 0.001 µm to about 0.02 µm thick.

Generally, the oxide that forms on the silicon-on-insulator structure 31 forms on all surfaces of the structure (top surface, bottom surface and sides (e.g., handle upper bevel, apex, lower bevel)). In some embodiments, a relatively thicker oxide exists toward the circumferential edge of the front surface 32 (e.g., where the donor did not bond exposing the buried oxide layer). This oxide may be referred to herein as a "terrace oxide". The width of the terrace oxide may vary with the edge shape of the wafer (e.g., 1 mm to 3 mm in width). The thickness of the terrace oxide may be a thickness to which the handle structure was oxidized.

Oxide Removal

In accordance with embodiments of the present disclosure, at least a portion of the oxide that forms on the silicon-on-insulator structure 31 is removed before deposition of an epitaxial silicon layer which is described below (e.g., the oxide that forms on the surface 32 of the structure 31 is at least partially or fully removed). In some embodiments of the present disclosure, at least a portion of the oxide is removed by a spin etch process in which the silicon-on-insulator structure 31 is rotated with the axis of rotation extending through the center C (FIG. 7) of the structure 31 with the axis being perpendicular to the surface 32 of the structure 31.

The spin-etch process may be a two-phase process (i.e., at least two phases) in which the etching solution is directed to the SOI structure (e.g., sprayed or otherwise directed from above the surface 32 of the structure onto the surface 32) while spinning the SOI structure. In a first phase, the etching solution is directed to a center region 42 (bound by dashed line in FIG. 7) of the top surface 32 of the silicon-on-insulator structure 31 while spinning the silicon-on-insulator structure 31. By spinning the structure 31, the etching solution fans out over the surface of the structure which allows it to etch and remove (i.e., strip) the oxide from the surface 32 of the structure 31. In this regard, the terms "etch" and/or "strip" as used herein should not be considered in a limiting sense and any process in which an oxide is removed from the surface of a silicon-on-insulator structure 31 by a chemical process in which the structure is contacted with a solution may be used unless stated otherwise.

The center region 42 of the top surface 31 of the silicon-on-insulator structure 31 may be relatively narrow (e.g., having a radius of less than 0.25*R or less than 0.1*R) to ensure that the center regions of the structure are contacted with etching solution. In some embodiments, the etching solution is directed to the center C of the silicon-on-insulator structure 31 during the first phase of the oxide removal.

After the first phase etch is complete, a second phase etch commences in which etching solution is directed to an edge region 45 of the top surface 32 of the silicon-on-insulator structure 31 while spinning the silicon-on-insulator structure 31. The edge region 45 is disposed radially outward from the center region 42. The edge region 45 (shown by the second dashed line) extends from a distance from the center C of the structure 31 to its circumferential edge E. For example, the edge region may start at a distance 0.66*R from the center C of the silicon-on-insulator structure 31 and extend to the circumferential edge E of the silicon-on-insulator structure 31. In other embodiments, the edge region begins at a distance 0.80*R or even 0.85*R from the center C of the silicon-on-insulator structure 31 and extends to the circumferential edge E of the silicon-on-insulator structure 31. The point at which acid is dispensed on the top surface of the SOI structure may be changed (i.e., transition from the first phase to the second phase) by radially repositioning the boom through which acid is dispensed.

The relative lengths of the first phase (center region distribution) and second phase (edge region distribution) may be selected based on the desired qualities of the SOI structure. In some embodiments, the first phase is from 0.5 seconds to 10 seconds (e.g., 3 to 5 seconds) and the second phase is from 10 second to about 20 minutes (e.g., 1 minute to about 15 minutes or from about 1 minute to about 10 minutes. In some embodiments, the flow rate of the acid is reduced in the second phase relative to the first phase (e.g., 90% or less, 75% or less or 50% or less of the flow rate in the first phase). Alternatively or in addition, the flow of etching solution may be paused while the etching solution is redirected from the center region to the edge region (e.g., while the boom is moved from the center region to the edge region).

The etching process may include additional phases including rinsing (e.g., using ozone-deionized water) and nitrogen stroke to reduce drying time. In some embodiments, the first phase at which etching solution is directed to the SOI structure is the only phase in which etching solution is directed to the center region 42. Alternatively or in addition, etching solution may be directed to the edge region 45 in two or more phases (e.g., the second phase described above, followed by a rinse phase distributed at the center, followed by a fourth phase in which etching solution is directed to the edge region 45).

In some embodiments, the etching solution includes hydrofluoric acid (HF) and acetic acid. In some embodiments, the ratio of hydrogen fluoric acid (49%) to acetic acid (glacial) in the etching solution is less than 1:1, less than 3:2, less than 2:1, less than 3:1 or 6:1 or less. Optionally, the etching solution may contain other additives such as various surfactants, buffers (e.g., ammonium fluoride), other oxidizing acids (e.g., HCl), and/or other oxidizing compounds ($H_2O_2$, ozone, etc.)

In some embodiments, the flow rate of the etching solution while distributing the etching solution to the center region and/or to the edge region is reduced relative to conventional oxide spin-etch processes. In some embodiments, the flow rate of etching solution (e.g., solution having HF and acetic acid) is about 600 ml/min or less or about 500 ml/min or less (e.g., about 100 ml/min to about 600 ml/min or about 100 ml/min to about 400 ml/min). In this regard, in embodiments in which the flow rate changes during the etching process, the flow rates described above may be time-averaged flow rates that are averaged while the etching solution is contacted with the SOI structure (e.g., and excludes rinsing steps).

Suitable apparatus for spinning the SOI structure includes, for example, the NexGen MG Series Single Wafer Wet Etch Platform sold by Entrepix (Phoenix, Ariz.). Other suitable apparatus may also be obtained from ACM Research (Fremont, Calif.), AP&S International GmbH (Donaueschingen, Germany), Decker Anlagenbau GmbH (Berching, Germany), KED Tech (Olive Branch, Miss.), LAM Research (Fremont, Calif.), PicoTrack USA (Santa Clara, Calif.), Screen Semiconductor Solutions (Kyoto, Japan), Tazmo Co., Ltd. (Fremont, Calif.), and Veeco (Plainview, N.Y.). The etching process may be performed under conditions that are sufficient to remove the oxide from the top surface of the SOI structure without promoting HF undercuts of voids on the surface. For example and in accordance with some embodiments of the present disclosure, the SOI structure may be spun at 300 to 2500 RPM and at an acid dispense rate of 350 to 2500 ml/min. In accordance with some embodiments of the present disclosure, the oxide removal process does not involve a masking step and/or involve immersion of the SOI structure.

The etch process described above removes at least a portion of the oxide on the surface 32 of the silicon-on-insulator structure 31. In some embodiments, the oxide is removed from the entire top surface 32 of the structure (i.e., the terrace edge oxide is removed). The etch process may also remove all or a portion of the oxide from the side of the structure 31 (e.g., handle upper bevel, apex, lower bevel). The oxide on the side of the structure may be removed as a result of etching solution running down the side of the wafer during the spin etch. As the etching solution flows over the side of the structure 31, a portion may also contact the back surface of the structure 31 (e.g., by capillary action) and remove a portion of the oxide in an edge region of the back surface of the wafer (e.g., from 0 to 1 mm of the back surface).

Silicon-on-Insulator Epitaxy

Once the oxide has been at least partially removed from the top surface 32 of the structure 31, a silicon epitaxial layer may be deposited on the top surface 32 of the structure 31 to increase the thickness of the silicon device layer. Silicon may be deposited by any epitaxial process availed to those of skill in the art. In some embodiments, the epitaxial process increases the thickness of the silicon layer 25 to 1 µm or more.

Generally, silicon may be deposited by any of the known methods available to those of skill in the art. For example, the silicon may be deposited using metalorganic chemical vapor deposition (MOCVD), physical vapor deposition (PVD), chemical vapor deposition (CVD), low pressure chemical vapor deposition (LPCVD), plasma enhanced chemical vapor deposition (PECVD), or molecular beam epitaxy (MBE). Silicon precursors for LPCVD or PECVD include methyl silane, silicon tetrahydride (silane), trisilane, disilane, pentasilane, neopentasilane, tetrasilane, dichlorosilane ($SiH_2Cl_2$), trichlorosilane ($SiHCl_3$), silicon tetrachloride ($SiCl_4$), among others. For example, silicon may be deposited onto the surface oxidation layer by pyrolyzing silane ($SiH_4$) in a temperature range between about 550° C. and about 690° C., such as between about 580° C. and about 650° C. The chamber pressure may range from about 70 to about 400 mTorr.

Compared to conventional methods for preparing a silicon-on-insulator structure, the methods of the present disclosure have several advantages. The spin etch process allows the oxide on the top surface and sides of the SOI structure to be removed while maintaining the backside oxide. Backside oxide may protect the bottom surface of the SOI structure against scratching and damage when the SOI structures is handled and may act as a backside seal to prevent contamination or autodoping of the SOI structure during epitaxy. The center-to-edge spin etch allows the terrace oxide near the edge of the SOI structure to be removed which improves epitaxial deposition toward the edge. The epitaxially thickened silicon layer may be characterized by improved uniformity and reduced particulate defectivity. For example, polysilicon nodules that form at the edge of the top silicon layer may be reduced or prevented. Such nodules impart a cosmetically visible hazy (top silicon) edge, which may be perceived as a defect (contamination) with front surface inspection. During deposition of the silicon epitaxial layer, nodules or grains may flake off the structure and fall onto the top silicon layer in the interior of the SOI structure leading to LLS defects or, in some instances, polysilicon formation on the top silicon surface.

A terrace oxide allows polysilicon to nucleate and grow and shed particles. Because this effect increases with increasing temperature, reduction or elimination of the terrace oxide allows for higher temperature epitaxy to be used which also improves the quality of the epitaxial layer.

The center-to-edge process also reduces the extent of HF undercuts because the contact time with etchant is reduced. HF undercuts may be further reduced by use of lower etching solution rates (e.g., less than 600 ml/min or less than 500 ml/min) and/or a relatively lower acetic acid concentration (e.g., less than 1:1, less than 3:2, less than 2:1, less than 3:1 or 6:1 or less). Use of a relatively lower flow rate during center etch reduces the film thickness and shortens the dewetting time, thereby reducing the contact time that HF wets the surface. Reduction of the acetic acid concentration is believed to reduce HF undercuts at void regions because the surfactant concentration is reduced, thereby increasing the contact angle of HF and bare silicon (and reducing the contact angle with HF and silicon oxide) and increasing the capillary pressure in the undercut region.

Embodiments of the center-to-edge acid disposition process in which the acid is directed to the center region for a relatively short time (e.g., less than 10 seconds or less than 5 seconds) followed by moving to edge region dispense to remove the terrace oxide reduces or eliminates splashing of the etching solution during edge dispense. Splashing may be further reduced when the etching solution is paused between center region distribution to edge region distribution. This pause in etchant may also promote dewetting of the wafer top surface that is interior to the edge region which further reduces HF undercuts. Reduction or elimination of splashing is advantageous as splashing forms aerosols of etch which may be entrained by the exhaust, causing increased fumes. Such fumes typically must be removed before releasing the fumes to the atmosphere. The etch aerosol may also enter the tool outside of the exhaust flow, causing damage to tool components and reducing the lifetime of the tool. The aerosol may also cause surface defects on the wafer when viewed by automated surface inspection. Splashing also reduces the volume of recovered acid, thereby increasing acid consumption per wafer.

EXAMPLES

The processes of the present disclosure are further illustrated by the following Examples. These Examples should not be viewed in a limiting sense.

Figure 8:
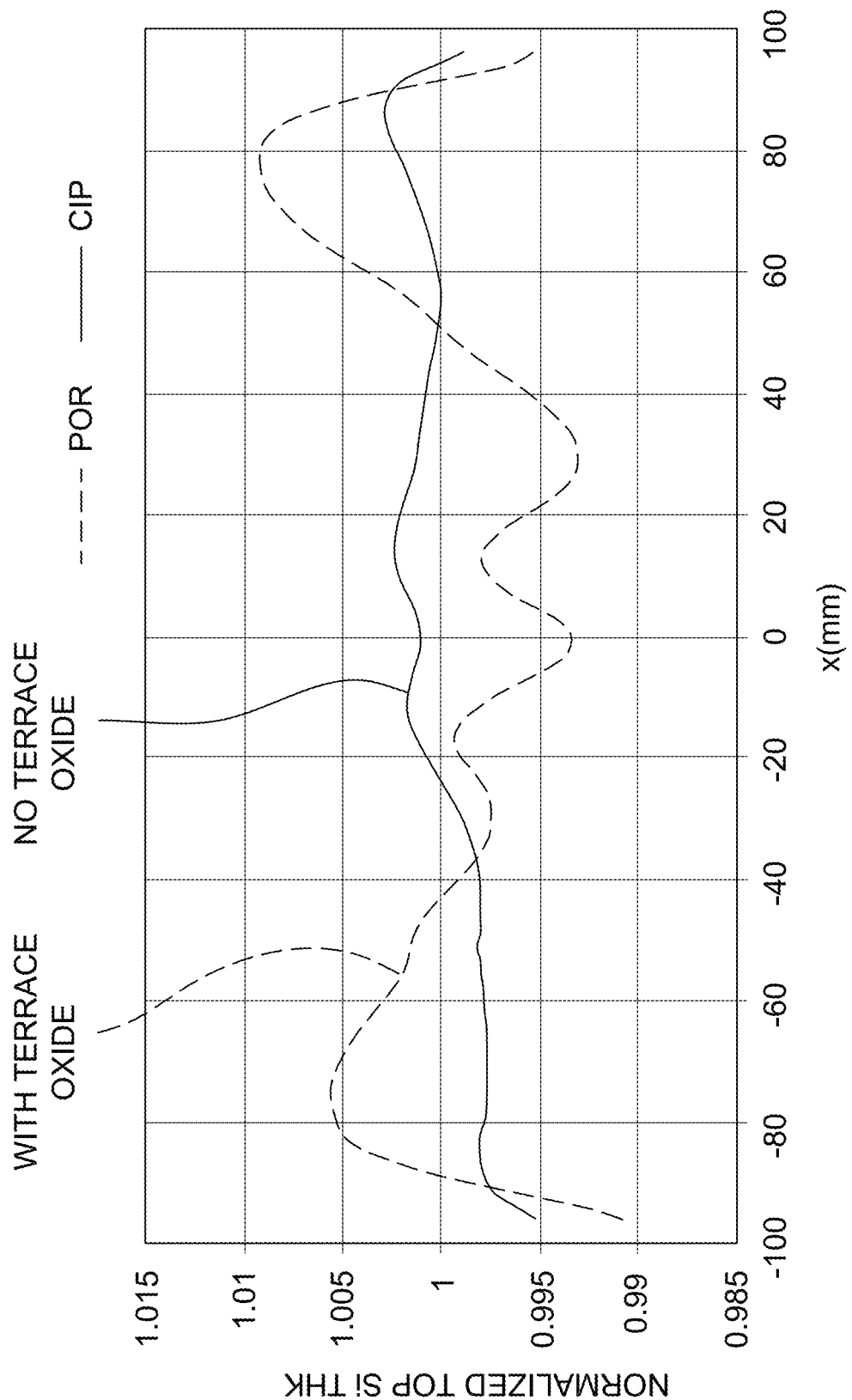
FIG. 8 is a graph of the thickness uniformity of an epitaxial layer deposited on a SOI structure with and without a terrace oxide.

Example 1: Thickness Uniformity and Silicon Edge Quality with and without Terrace Oxide The thickness uniformity of an epitaxial layer grown on the silicon layer of a silicon-on-insulator structure which included a terrace oxide on the surface of the structure and the thickness uniformity of an epitaxial layer grown on the silicon layer of a silicon-on-insulator structure free of a terrace oxide are shown in FIG. 8. Elimination of the terrace oxide allows the epitaxial deposition to be performed at higher temperature where silicon adatoms can surface diffuse and incorporate or assimilate more readily into the single crystal lattice structure. As shown in FIG. 8, the high temperature epitaxial process without a terrace ("No Terrace Oxide") is more uniform than the low-temperature epitaxial process with a terrace oxide ("With Terrace Oxide").

FIG. 9 shows the edge of the top-silicon after epitaxial deposition. The left panel is the top-silicon at low temperature with an oxide terrace edge and the two right panels are top-silicon at high temperature epi without an oxide terrace edge. The top-silicon of the SOI structure with a terrace edge includes grain or nodules toward the edge of the top-silicon layer.

Example 2: HF Undercut without Center-Only Distribution of Etchant Solution

Figure 10:
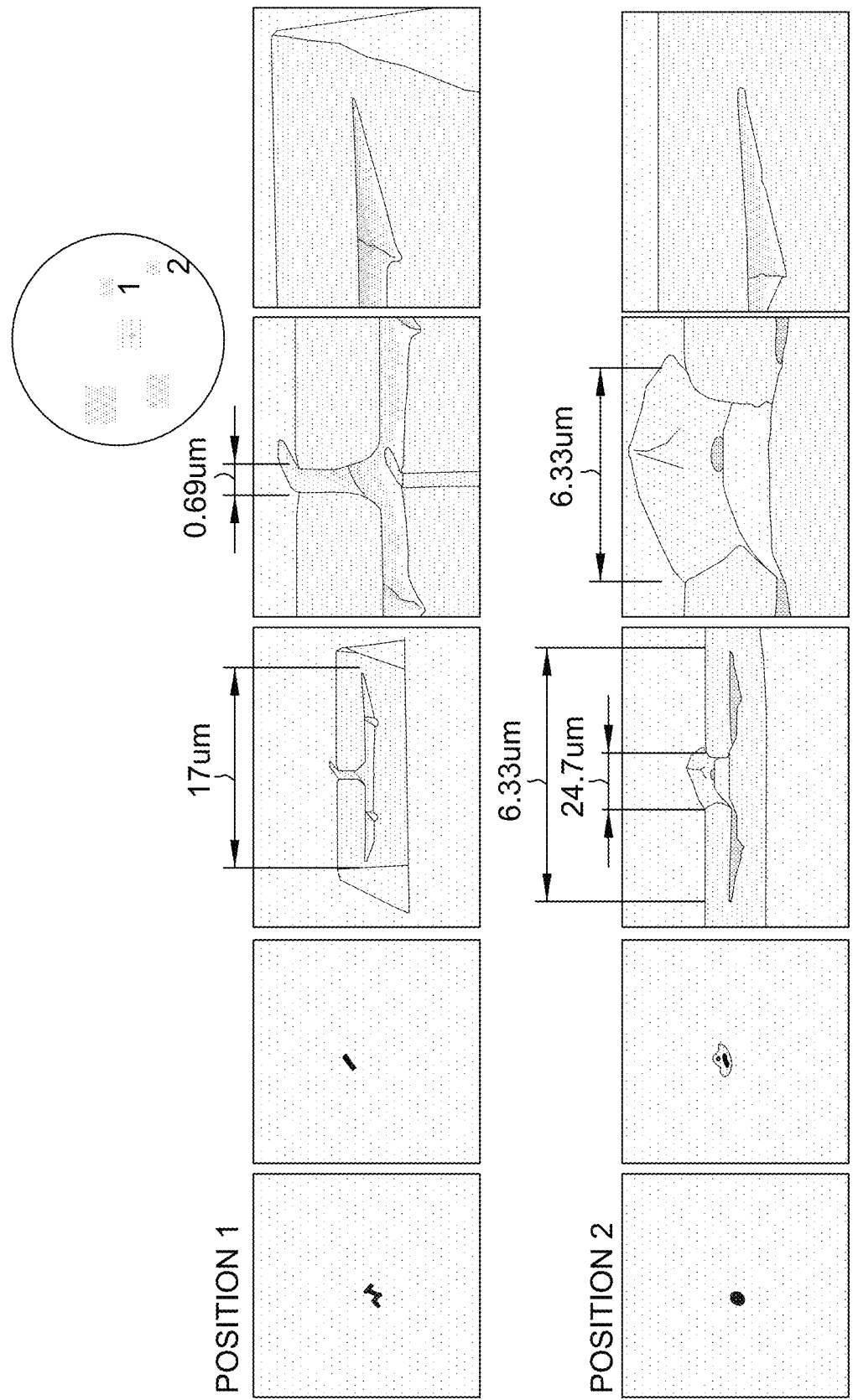
FIG. 10 are schematics of the HF undercut during epitaxial deposition.

An oxide etch solution (3:4 HF:acetic acid by volume (80% acetic acid) ratio which is equivalent to a 3.5:3.8:1 HF:glacial acetic acid:water ratio) was dispensed at the center of a spinning SOI structure. The SOI structure was spun at 1900 RPM on a SEZ 223 spin etch tool with an acid dispense rate of 1500 ml/min. As shown in FIG. 10, the resulting structure included HF undercuts at the voids in the silicon layer.

Figure 11:
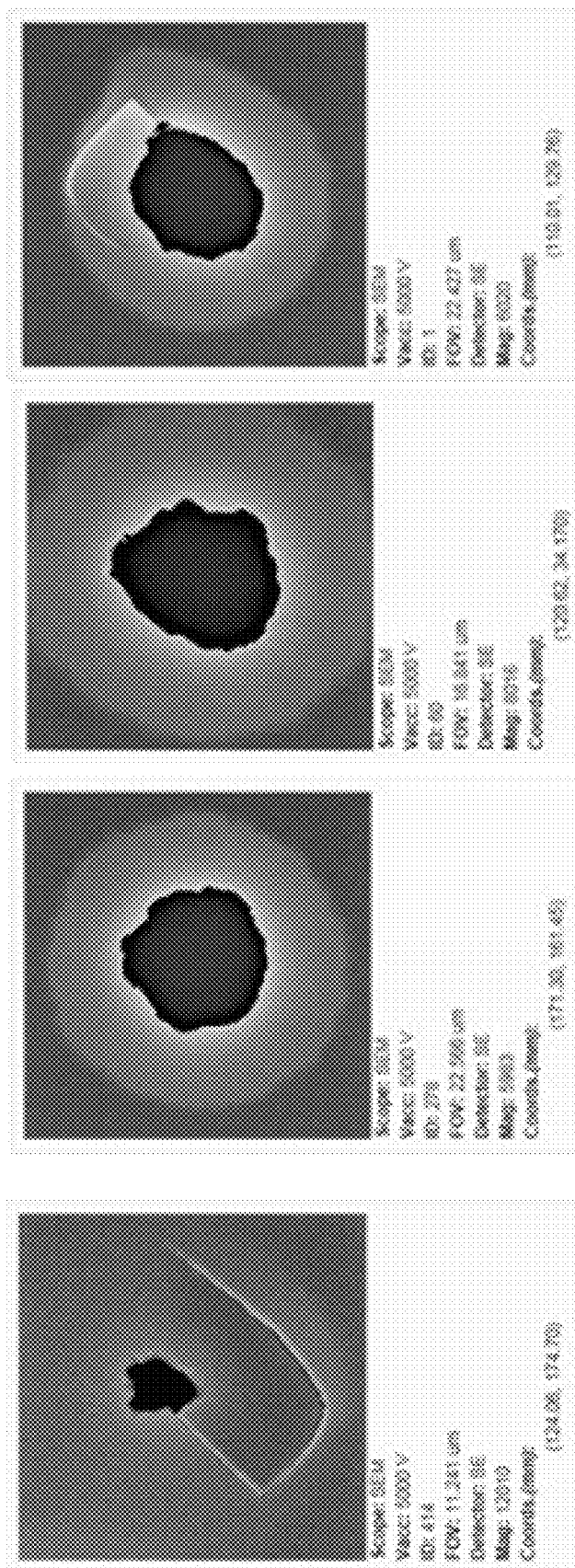
FIG. 11 are photos of the HF undercut at voids after a center spin etch oxide stripping process.

An oxide etch solution (6:1 HF:acetic acid by volume (glacial, 100%)) was dispensed at the center of a spinning SOI structure. The SOI structure was spun at 700 rpm with a NexGen MG22 spin etcher with an acid dispense rate at 2000 ml/min. As shown in FIG. 11, the resulting structure included HF undercuts at the voids in the silicon layer. As shown in FIG. 11, the undercut is so severe that the top silicon is no longer well supported and begins to flake. Undercut on the images appears as a lighter colored band around the void (which is darker). The edge of the HF undercut appears smooth and more diffuse than the void which has rough or jagged edges.

Example 3: Comparison of HF Undercut with Center-Only and Center-to-Edge Distribution of Etchant Solution A SOI structure (200 mm diameter) was stripped of oxide according to the steps shown in the top panel of Table 1 below in which acid was only distributed at the center of the structure. After the HF:acetic acid etch (280 seconds), the structure was rinsed with ozone-deionized water and was exposed to nitrogen. These cycles were repeated for the SOI structure (steps 1-3 performed twice) with a 560 second total acid dispense time.

Another SOI structure (200 mm diameter) was stripped of oxide by the steps of the bottom panel of Table 1. After a 3 second HF:acetic acid etch with acid distribution at the center of the structure, the boom was moved to 90 mm from the center of the structure (10 mm from the edge) and acid was distributed for 280 seconds. Following an ozone-deionized water rinse, the HF:acetic acid etch at 90 mm from the center of the structure was repeated (563 total acid dispense time). This was followed by another rinse and exposure to nitrogen.

TABLE 1

| Step | Time, sec | Speed, rpm | Flowrate, mlpm | Media | Dispense Position, mm |
|---|---|---|---|---|---|
| Center-Only | | | | | |
| 1 | 280 | 700 | 1800 | HF:HOA$_C$ | 0 |
| 2 | 25 | 800 | 300 | DIWO$_3$ | 0 |
| 3 | 3 Strokes | 1800 | 1800 | N$_2$ | Stroke |
| 1 | 280 | 700 | 1880 | HF:HOA$_C$ | 0 |
| 2 | 25 | 800 | 300 | DIWO$_3$ | 0 |
| 3 | 3 Strokes | 1800 | 1800 | N$_2$ | Stroke |
| Center-to-Edge | | | | | |
| 1 | 3 | 400 | 400 | HF:HOA$_C$ | 0 |
| 2 | 280 | 400 | 400 | HF:HOA$_C$ | -90 |
| 3 | 25 | 800 | 300 | DIWO$_3$ | 0 |
| 4 | 280 | 400 | 400 | HF:HOA$_C$ | 0 |
| 5 | 25 | 800 | 300 | DIWO$_3$ | 0 |
| 6 | 3 Strokes | 1800 | 1800 | N$_2$ | Stroke |

Etch recipes that involve center-only distribution of etchant (top panel) and center-to-edge distribution of etchant (bottom panel)

Figure 12A:
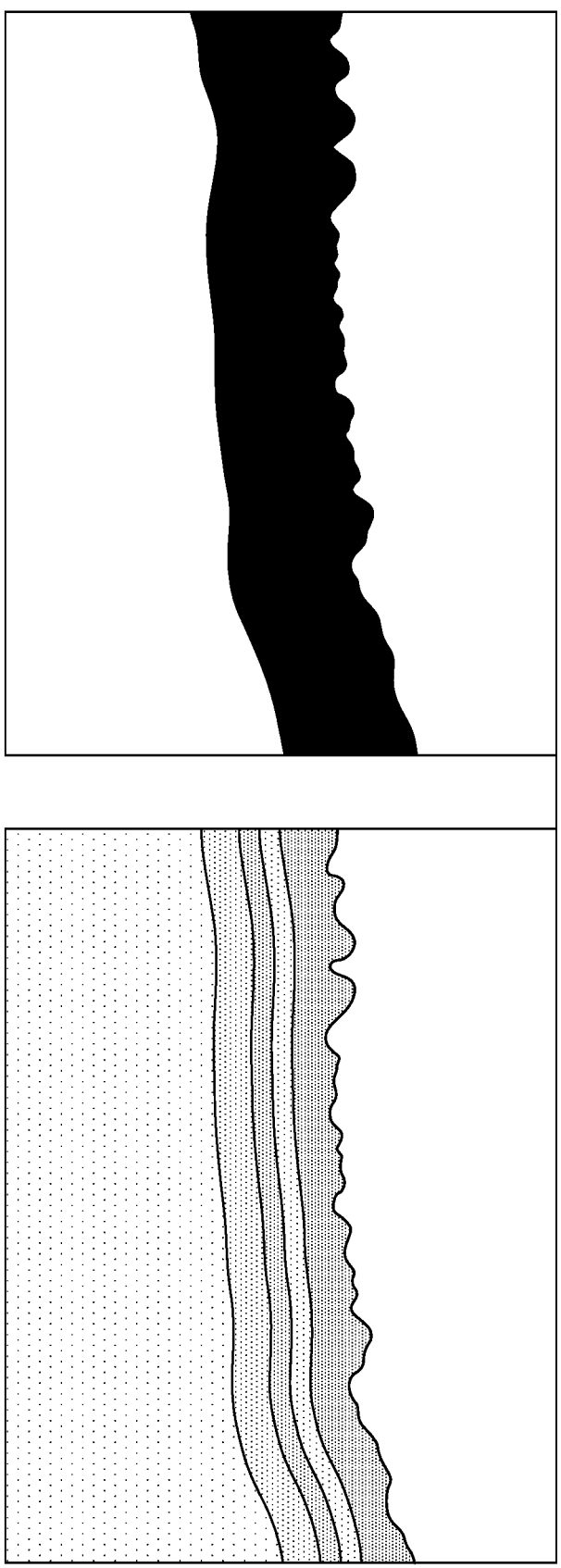
FIG. 12 are images of the HF undercut produced by center-only dispense (FIG. 12A) and center-to-edge dispense (FIG. 12B)
Figure 12B:
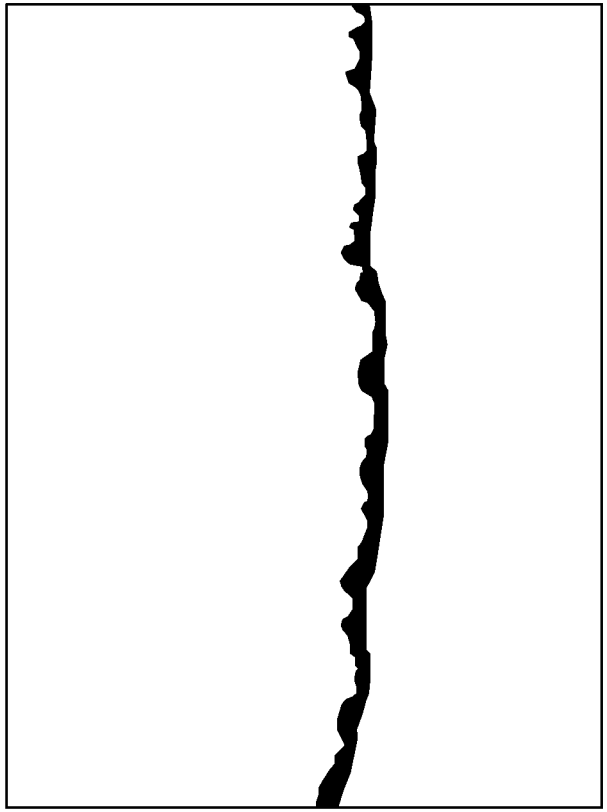

The undercuts were determined by software processing tools such as ImageJ in which the area of the undercut is measured (i.e., between the edge of the top silicon and the point where the BOX is not undercut—the interior of the undercut) in the respective micrograph (FIG. 12A and FIG. 12B). The average length of the line (the average between the length of edge of the top silicon and length of the interior of the undercut region) is measured. Dividing the area by the average length gives the average undercut. The undercut produced by the center-only dispense is shown in FIG. 12A and the undercut produced by the center-to-edge dispense is shown in FIG. 12B. The HF undercut produced by the center-only dispense was 18.9 μm while the undercut produced by the center-to-edge dispense was 2.6 μm.

Example 4: Reduction in Flow Rate in Center-to-Edge Process

Figure 13:
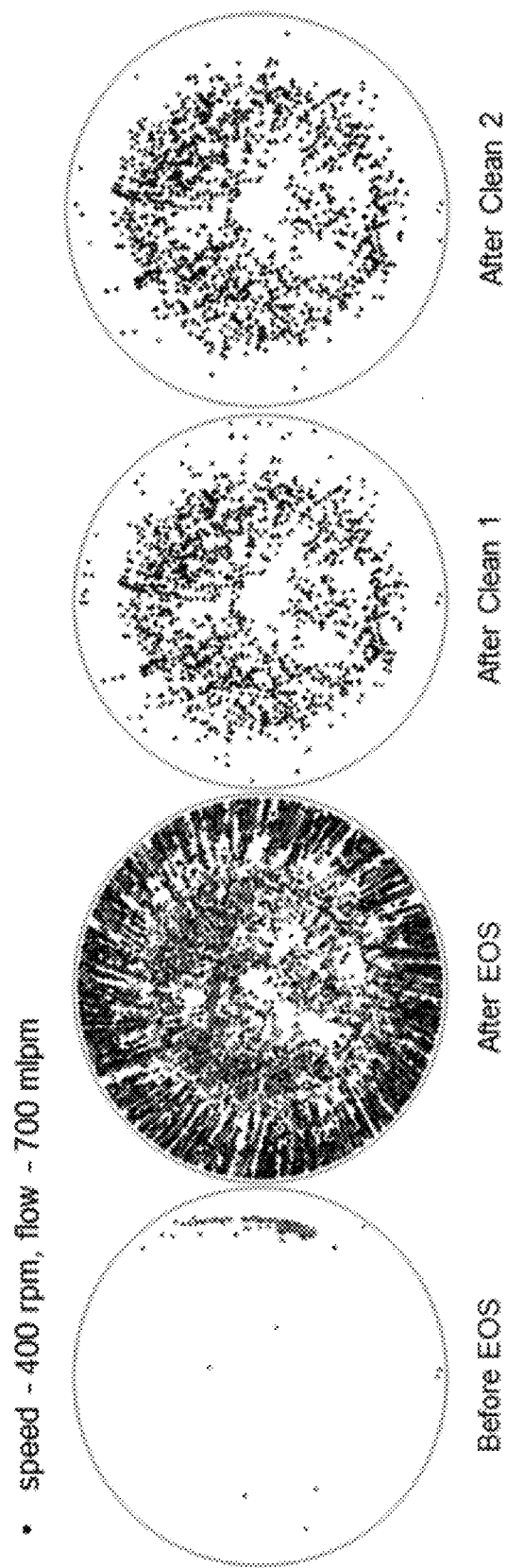
FIG. 13 are defect maps for edge dispense at a 700 ml/min flow rate.

A SOI structure (200 mm) was spun at 400 rpm while edge dispensing a HF:acetic acid solution (90 mm from center, i.e., 10 mm from edge) at a flow rate of 700 ml/min for 60 seconds. Another SOI structure (200 mm) was spun at 400 rpm while edge dispensing a HF:acetic acid solution (90 mm from center, i.e., 10 mm from edge) at a flow rate of 400 ml/min for 60 seconds. The image maps (KLA-Tencor SPI-TBI maps) are shown in FIG. 13 (400 ml/min) and FIG. 14 (700 ml/min). The SOI structures were not center etched.

Figure 14:
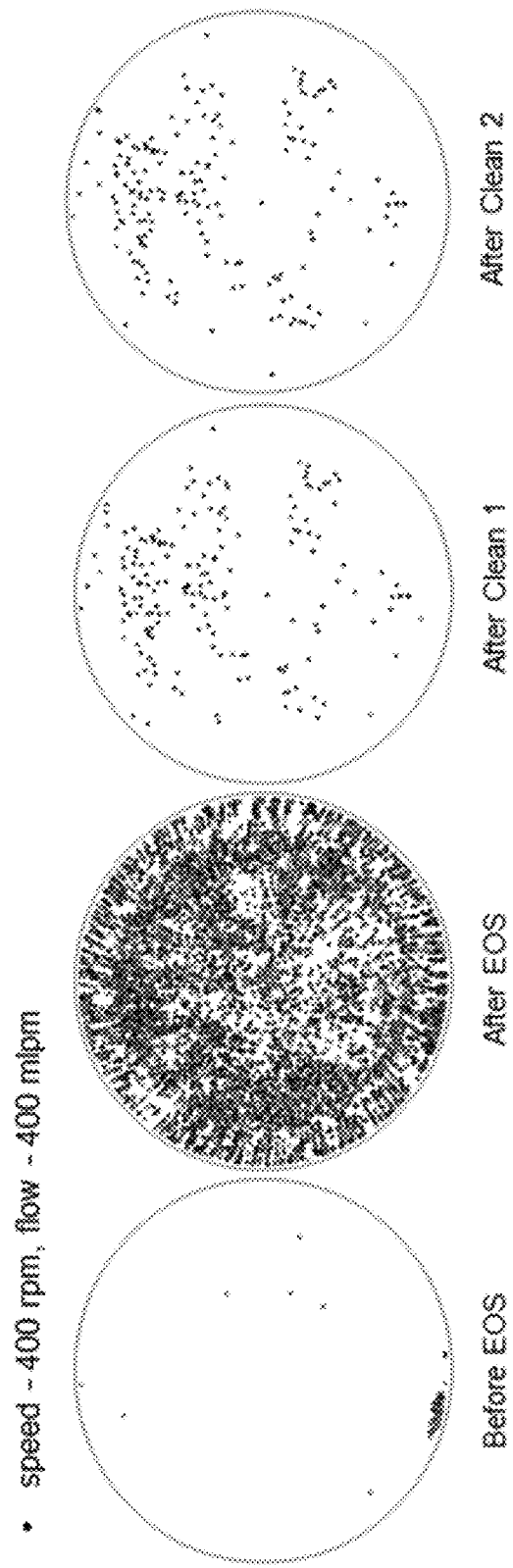
FIG. 14 are defect maps for edge dispense at a 400 ml/min flow rate.

The left most image in FIGS. 13 and 14 is a SP1 map of the wafer before the edge oxide strip. The second image from the left is the SP1 map after processing the edge oxide strip. The third image from the left is a SP1 map after a SC1 and SC2 clean. The fourth image (right-most) image is a map after a second cleaning which shows the non-removable defects. The SP1 map for the wafer processed at 400 ml/min (FIG. 14) shows less defectivity.

Example 5: Comparison of Center-to-Edge Spin Etch and Immersion Wet Bench

SOI structures were processed with center-to-edge distribution of acid to remove the terrace oxide with standard cleaning operation (SC1, SC2 and ozone bath cleaning in a linear, immersion wet bench) ("QEE (EOS+HTE)"). SOI structures were processed to remove the annealing oxide in a linear, immersion wet bench (without terrace oxide removal) followed by the same standard cleaning operation ("QEB (POR)").

Figure 15:
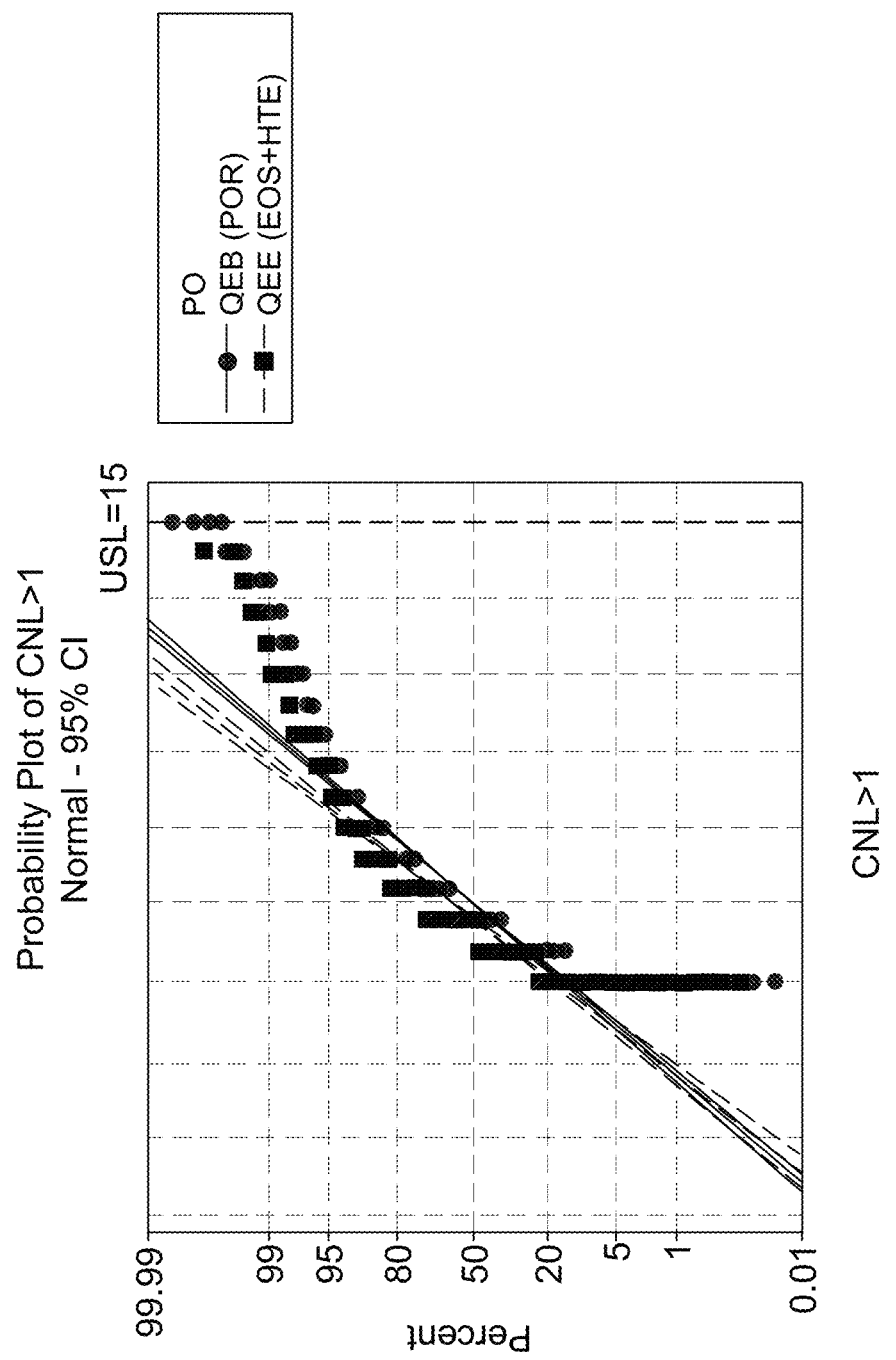
FIG. 15 is a SP1 surface comparison of a SOI top silicon surface with and without terrace oxide removal with LPDs counts greater than or equal to 1 μm.
Figure 16:
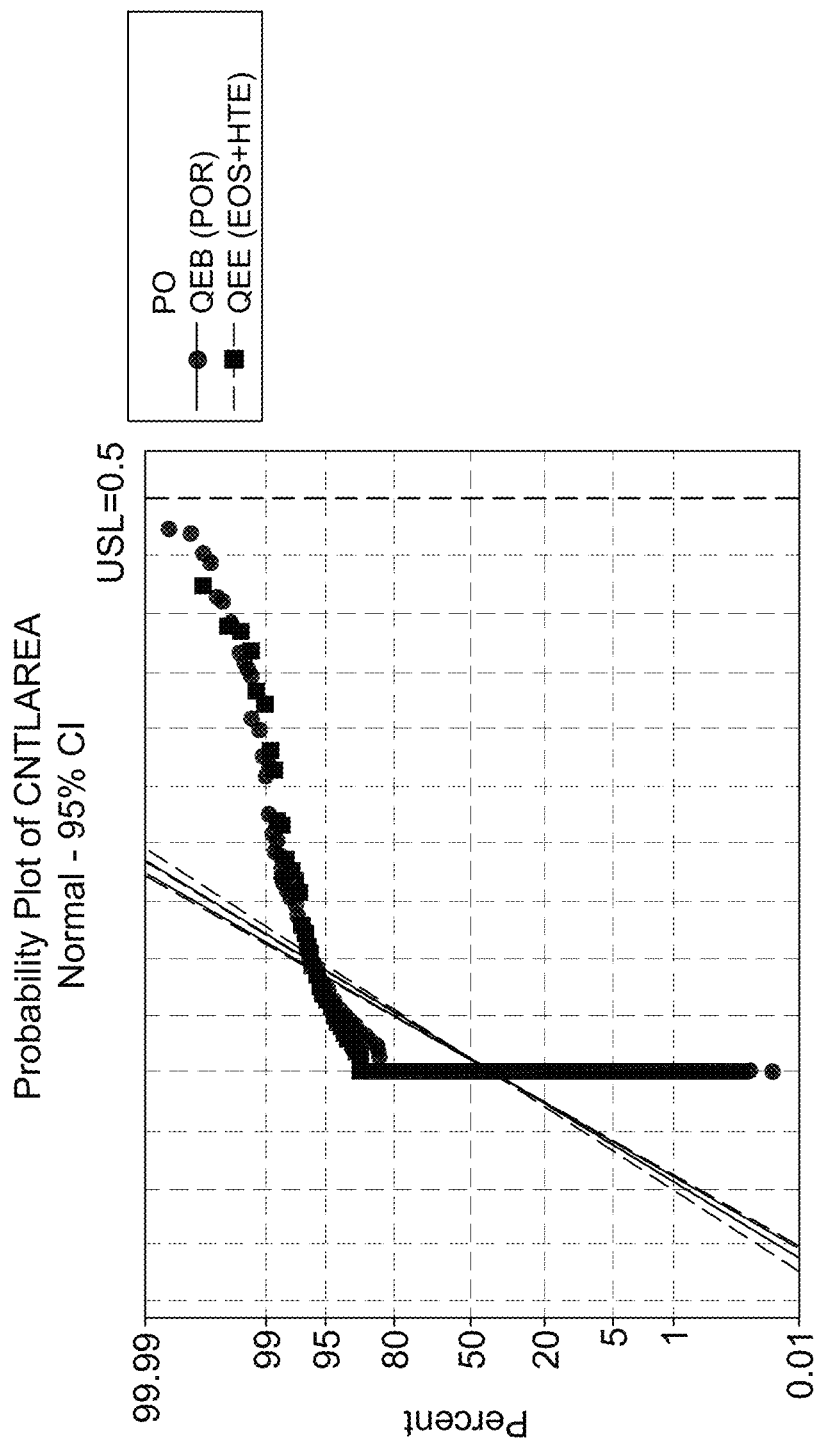
FIG. 16 is a SP1 surface comparison of a SOI top silicon surface with and without terrace oxide removal showing total defect area (mm$^2$) per wafer.

The probability distribution of SOI structures for both sets of structures are shown in FIGS. 15 and 16. Using statistical hypothesis testing, e.g., Leven's test, it can be shown the distributions for particle counts (composite, normal mode, LPD-N)>1 μm (CNL>1) (FIG. 15) or total area counts (CNTLAREA) (FIG. 16) are not different for the two sets of structures. This was expected because the terrace oxide strip process should not impact the surface.

Figure 17:
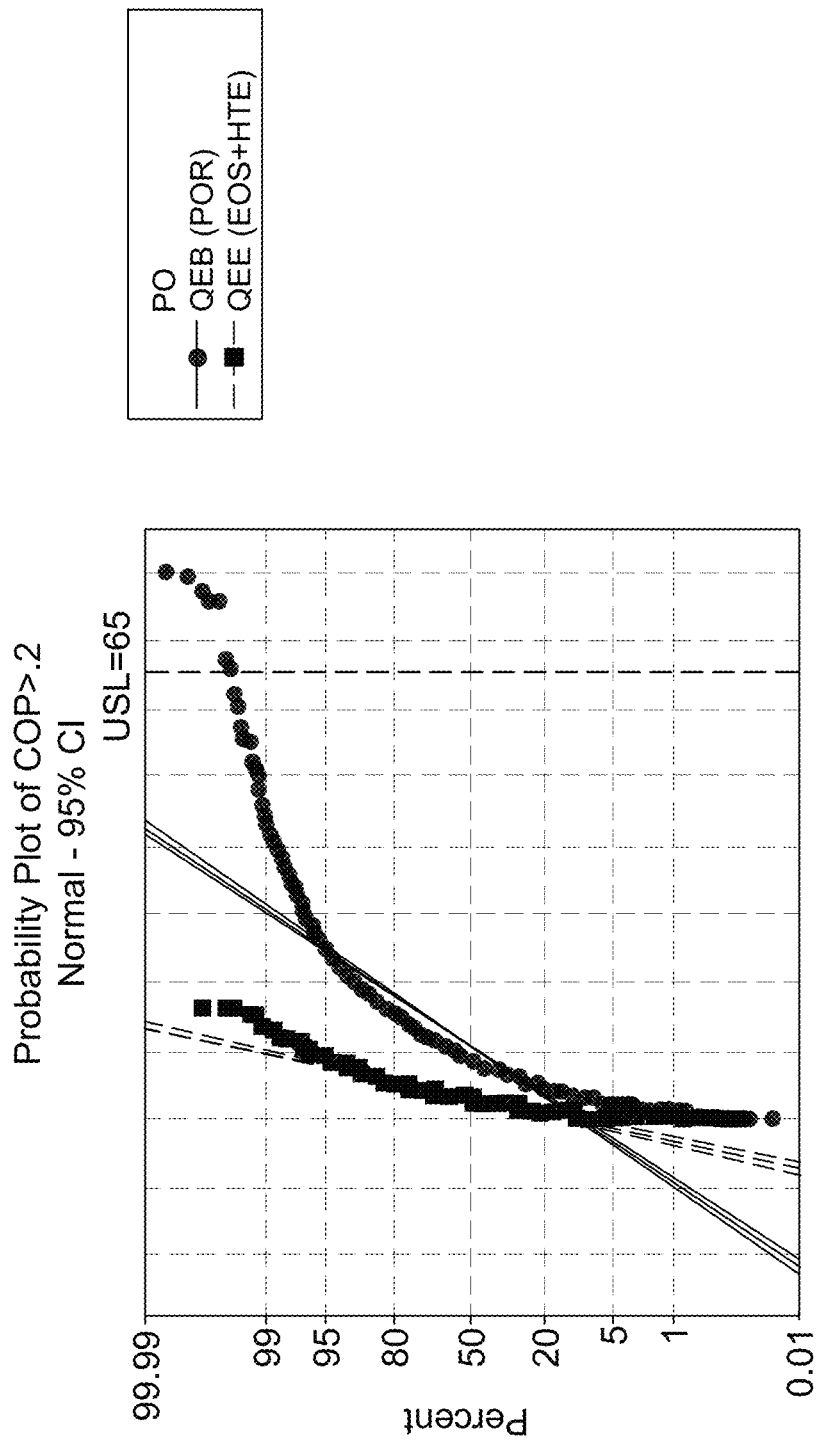
FIG. 17 is a SP1 surface comparison of post epitaxy top silicon surface inspection with a count of particles 0.2 μm or greater.
Figure 18:
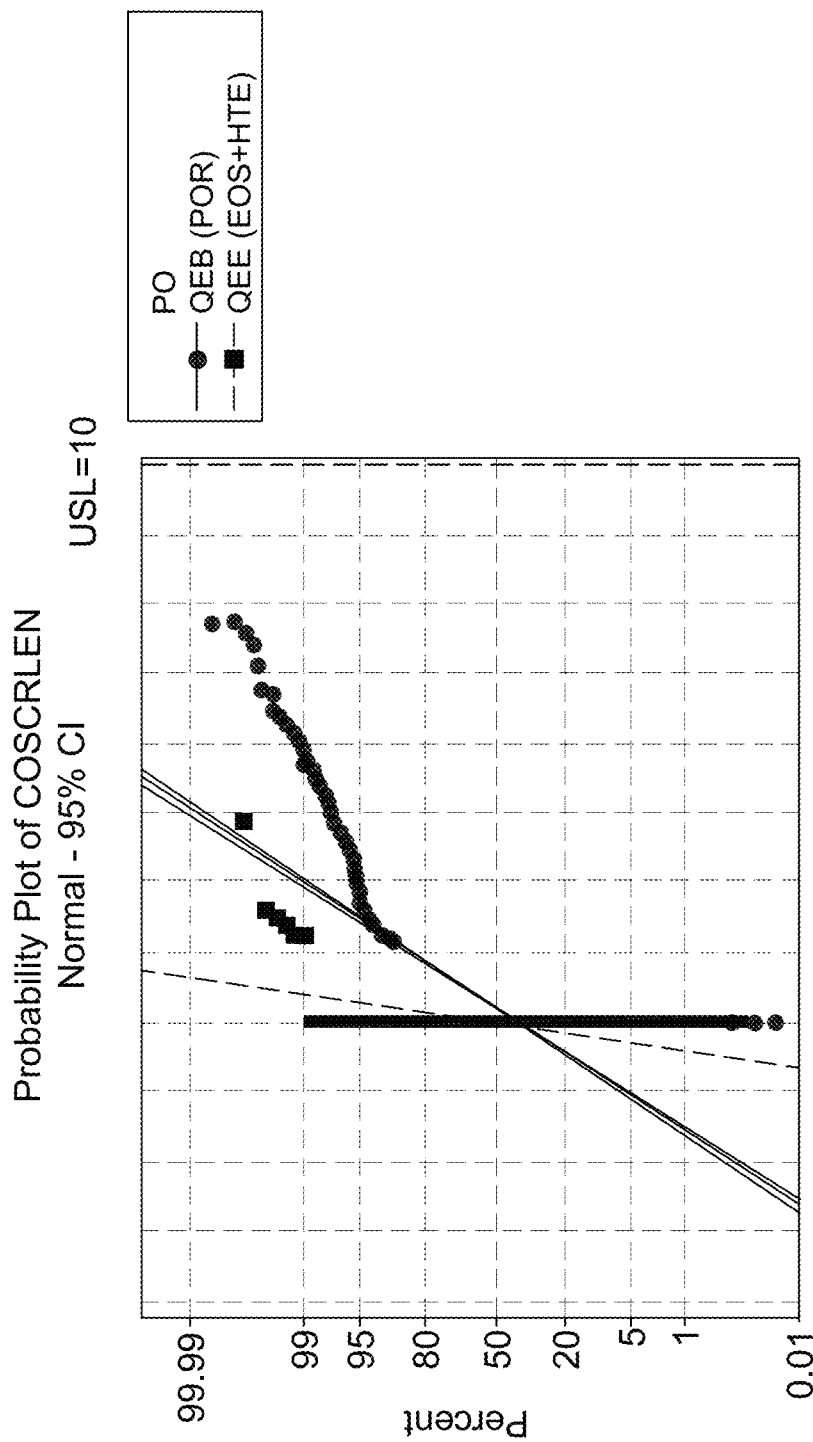
FIG. 18 is a SP1 surface comparison of post epitaxy top silicon surface inspection showing total scratch length.

An epitaxial layer was deposited on the SOI structures that underwent center-to-edge oxide stripping at relatively high temperature. An epitaxial layer was also deposited on the SOI structures that were oxide stripped by conventional methods (i.e., included terrace oxide). The top-silicon layer was increased from 0.15 μm to 1.0 μm for each structure. A defect map was prepared with a KLA Tencor SP1. FIG. 17 compares the defects (composite oblique, particle) greater than 0.2 μm in size (COP>0.2) and FIG. 18 compares the total scratch length (mm) (COSCRLEN) for the two sets of structures. In FIGS. 17 and 18, lower values (closer to 0) indicate less defectivity (particles).

Figure 19:
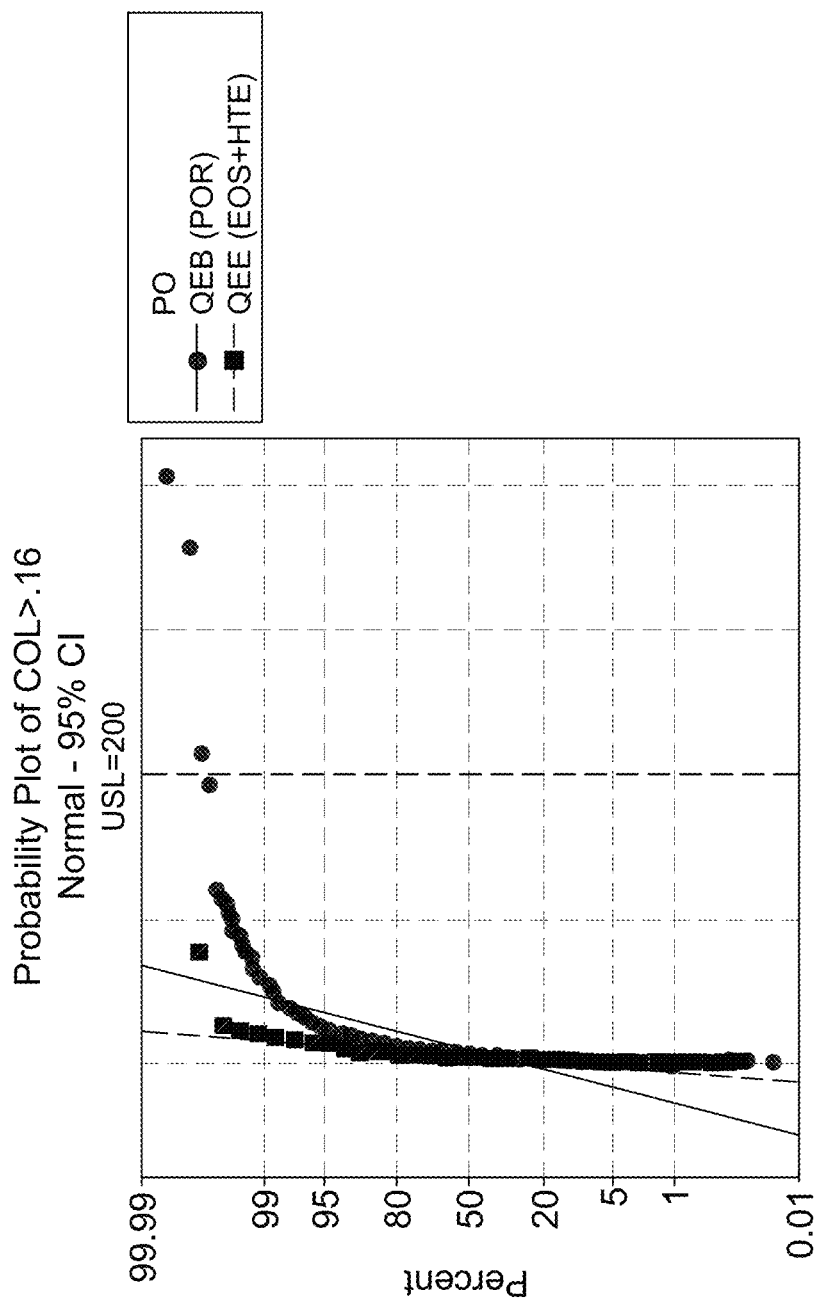
FIG. 19 is an end-of-line SP1 surface inspection comparison with a count of particles 0.16 μm or greater.
Figure 20:
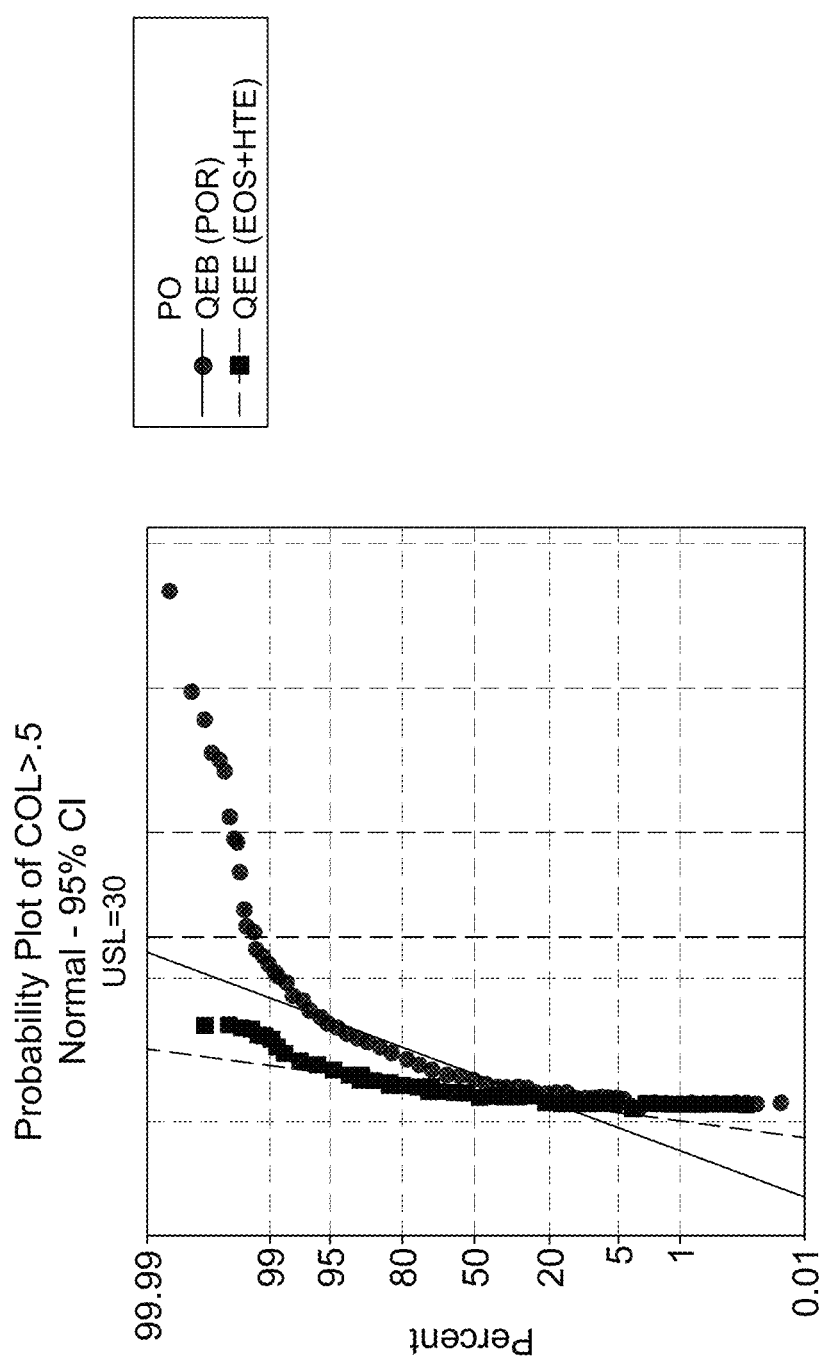
FIG. 20 is an end-of-line SP1 surface inspection with a count of particles 0.5 μm or greater.
Figure 21:
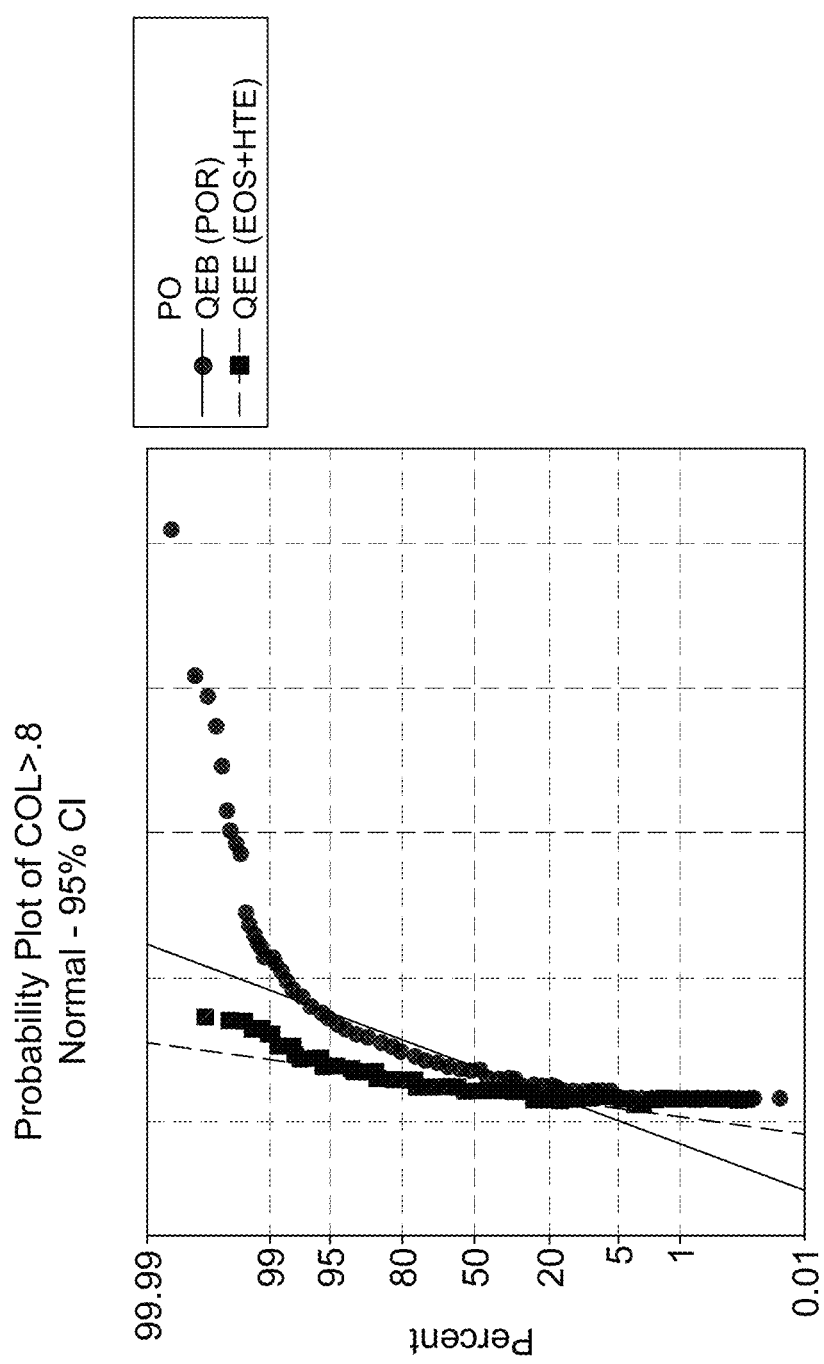
FIG. 21 is an end-of-line SP1 surface inspection with a count of particles 0.8 μm or greater.

The same two groups of wafers were subjected to a final cleaning with various metrology and inspections and a final SP1 surface inspection. End-of-line SP1 surface inspection with particles of a size 0.16 μm and greater is shown in FIG. 19, 0.5 μm and greater is shown in FIG. 20, and 0.8 μm and greater is shown in FIG. 21. In all cases, the center-to-edge acid distributed (EOS+HTE) processed structures (i.e. those wafers which had the terrace oxide removed) exhibited lower counts and these differences are statistically significant at the 95 percent confidence level.

Figure 22:
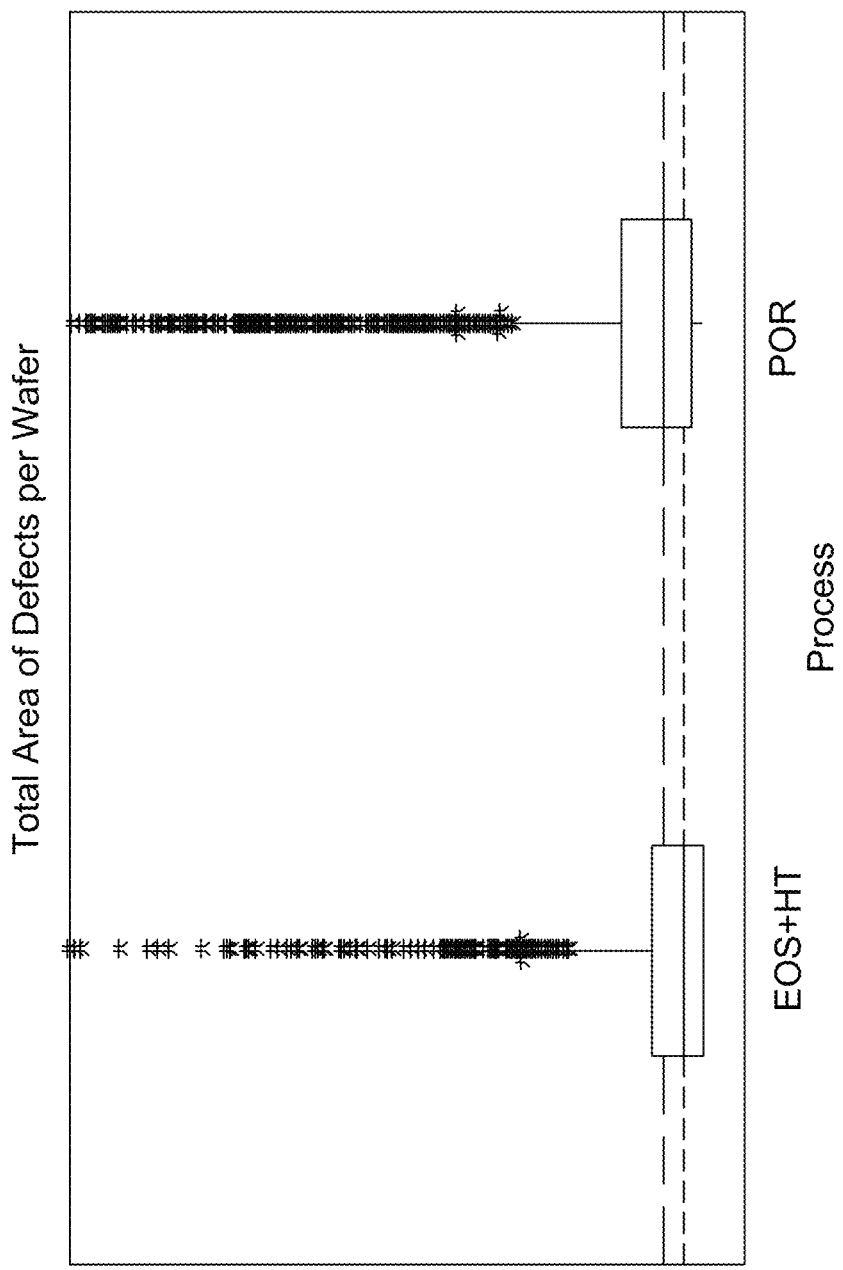
FIG. 22 is a box plot comparison of the total area of defects per wafer for a count of wafers.
Figure 23:
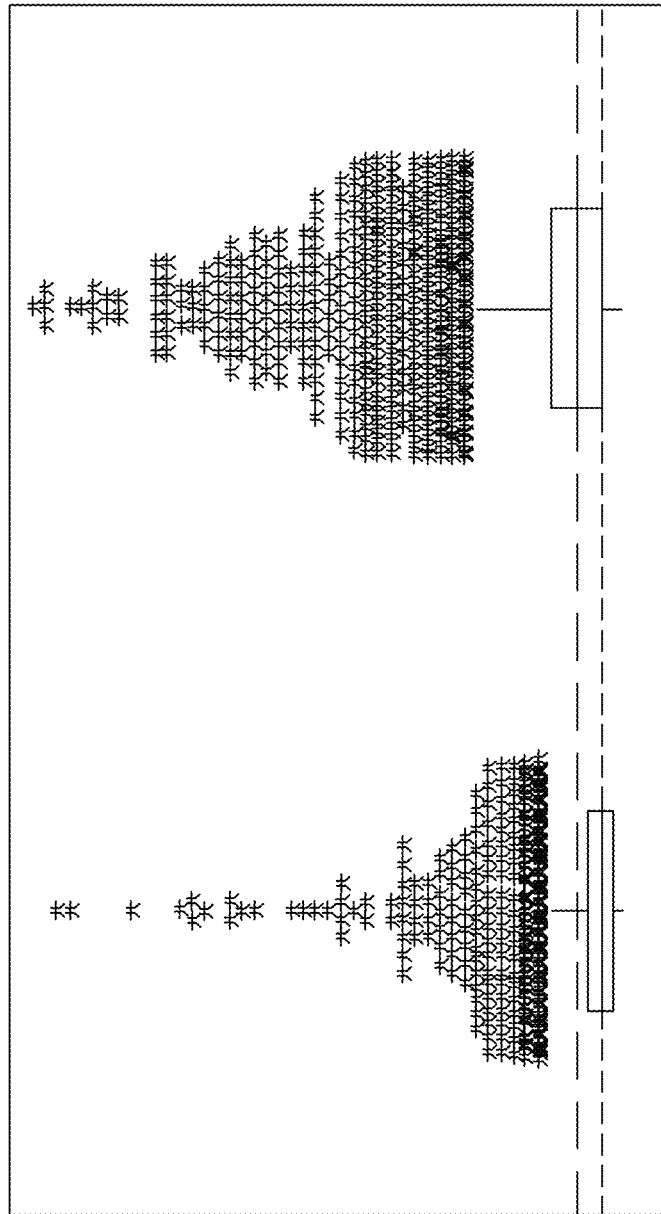
FIG. 23 is a box plot comparison of the defect count per wafer for defects 0.8 μm or greater for a count of wafers.

FIGS. 22 and 23 are box plots comparing SOI wafers with center-to-edge acid distribution (EOS+HTE) and conventional SOI wafers (POR) over a count of wafers. FIG. 22 shows the total area of defects per wafer for the set of wafers and FIG. 23 shows the defect count per wafer for defects 0.8 μm or greater for the set of wafers.

Center-to-edge acid distribution with low dispense rate (e.g., 500 ml/min or less) with high temperature epitaxy has been demonstrated to improve yield by 4 to 6% with lower surface defectivity.

As used herein, the terms "about," "substantially," "essentially" and "approximately" when used in conjunction with ranges of dimensions, concentrations, temperatures or other physical or chemical properties or characteristics is meant to cover variations that may exist in the upper and/or lower limits of the ranges of the properties or characteristics, including, for example, variations resulting from rounding, measurement methodology or other statistical variation.

When introducing elements of the present disclosure or the embodiment(s) thereof, the articles "a", "an", "the" and "said" are intended to mean that there are one or more of the elements. The terms "comprising," "including," "containing" and "having" are intended to be inclusive and mean that there may be additional elements other than the listed elements. The use of terms indicating a particular orientation (e.g., "top", "bottom", "side", etc.) is for convenience of description and does not require any particular orientation of the item described.

As various changes could be made in the above constructions and methods without departing from the scope of the disclosure, it is intended that all matter contained in the above description and shown in the accompanying drawing[s] shall be interpreted as illustrative and not in a limiting sense.

What is claimed is:

1. A method for preparing a silicon-on-insulator structure comprising a silicon top layer, a handle structure and dielectric layer disposed between the silicon top layer and handle structure, the method comprising:
    implanting ions into a donor structure to form a cleave plane in the donor structure;
    providing a handle structure;
    forming a dielectric layer on at least one of the donor structure and handle structure prior to bonding;
    bonding the donor structure to the handle structure to form a bonded wafer structure comprising the donor structure, handle structure and a dielectric layer disposed between the handle structure and the donor structure;
    cleaving the bonded wafer structure at the cleave plane such that a portion of the donor structure remains bonded to the handle structure as a silicon top layer, the cleave forming a silicon-on-insulator structure comprising the handle structure, silicon top layer and dielectric layer disposed between the handle structure and silicon top layer;
    annealing the silicon-on-insulator structure, an oxide forming on at least a top surface of the silicon-on-insulator structure during the anneal;
    contacting a center region of the top surface of the silicon-on-insulator structure with an etching solution while spinning the silicon-on-insulator structure; and
    contacting an edge region of the top surface of the silicon-on-insulator structure with the etching solution while spinning the silicon-on-insulator structure; and
    depositing an epitaxial silicon layer on the silicon top layer after contacting the center region and the edge region of the top surface of the silicon-on-insulator structure.

2. The method as set forth in claim 1 comprising forming a dielectric layer on the handle structure prior to bonding.

3. The method as set forth in claim 1 wherein the center region extends from the center of the silicon-on-insulator structure to 0.1*R.

4. The method as set forth in claim 1 wherein directing an etching solution to a center region of the top surface of the silicon-on-insulator structure comprises directing the etching solution to the center of the silicon-on-insulator structure.

5. The method as set forth in claim 1 wherein the edge region begins at a distance 0.85*R from the center of the silicon-on-insulator structure and extends to the circumferential edge of the silicon-on-insulator structure.

6. The method as set forth in claim 1 wherein the flow of etching solution is stopped while the etching solution is being redirected from the center region to the edge region.

7. The method as set forth in claim 1 wherein contacting the center region of the top surface of the silicon-on-insulator structure with an etching solution comprises directing the etching solution to the center of the silicon-on-insulator structure.

8. The method as set forth in claim 1 wherein the edge region begins at a distance 0.66*R from the center of the silicon-on-insulator structure and extends to the circumferential edge of the silicon-on-insulator structure.

9. The method as set forth in claim 1 wherein the edge region begins at a distance 0.80*R from the center of the silicon-on-insulator structure and extends to the circumferential edge of the silicon-on-insulator structure.

10. The method as set forth in claim 1 the etching solution comprises hydrofluoric acid and acetic acid, wherein the ratio of hydrogen fluoric acid (based on 49% basis) to acetic acid (glacial) in the etching solution is less than 1:1.

11. The method as set forth in claim 1 wherein the center region of the top surface of the silicon-on-insulator structure is contacted with etching solution at a rate of 600 ml/min or less and the edge region of the top surface of the silicon-on-insulator structure is contacted with etching solution at a rate of 600 ml/min or less.

12. The method as set forth in claim 1 wherein the center region of the top surface of the silicon-on-insulator structure is contacted with etching solution for 0.5 to 10 seconds.

13. The method as set forth in claim 1 wherein the edge region of the top surface of the silicon-on-insulator structure is contacted with etching solution for 10 seconds to 20 minutes.

14. The method as set forth in claim 1 wherein the etching solution that contacts the center region and the etching solution that contacts the edge region have the same concentration.

15. The method as set forth in claim 1 wherein the etching solution that contacts the center region and the etching solution that contacts the edge region have a different concentration.

16. The method as set forth in claim 1 wherein the etching solution that contacts the center region and the etching solution that contacts the edge region each comprise hydrogen fluoride and acetic acid.

17. The method as set forth in claim 1 comprising moving a boom through which the etching solution is discharged to redirect etching solution from the center region to the edge region.

* * * * *